(12) United States Patent
Kang

(10) Patent No.: US 6,240,007 B1
(45) Date of Patent: *May 29, 2001

(54) NONVOLATILE FERROELECTRIC MEMORY DEVICE HAVING GLOBAL AND LOCAL BITLINES AND SPLIT WORKLINE DRIVER

(75) Inventor: Hee Bok Kang, Daekeon-si (KR)

(73) Assignee: Hyundai Electronics Industries Co., Ltd., Ichon-shi (KR)

(*) Notice: Subject to any disclaimer, the term of this patent is extended or adjusted under 35 U.S.C. 154(b) by 0 days.

This patent is subject to a terminal disclaimer.

(21) Appl. No.: 09/432,104

(22) Filed: Nov. 2, 1999

(30) Foreign Application Priority Data

Nov. 3, 1998 (KR) .................................................. 98 47024

(51) Int. Cl.⁷ .................................................... G11C 11/22
(52) U.S. Cl. ...................... 365/145; 365/149; 365/230.06
(58) Field of Search ................................... 365/145, 149, 365/230.06, 203

(56) References Cited

U.S. PATENT DOCUMENTS

| | | | |
|---|---|---|---|
| 4,873,664 | 10/1989 | Eaton, Jr. ............................... | 365/145 |
| 5,680,344 | 10/1997 | Seyyedy ................................. | 165/145 |
| 5,995,406 | * 11/1999 | Kraus et al. ........................... | 365/145 |
| 6,091,622 | * 7/2000 | Kang ..................................... | 365/145 |
| 6,091,623 | * 7/2000 | Kang ..................................... | 365/145 |
| 6,091,624 | * 7/2000 | Kang ..................................... | 365/145 |

* cited by examiner

Primary Examiner—David Nelms
Assistant Examiner—Gene N. Auduong
(74) Attorney, Agent, or Firm—Fleshner & Kim, LLP

(57) ABSTRACT

Nonvolatile ferroelectric memory including a main cell array having a plurality of sub cell arrays, a plurality of main global bitlines and at least one pair of reference global bitlines formed across the sub cell arrays, main local bitlines and reference local bitlines formed in correspondence to the main global bitlines and the reference global bitlines, and switches provided between local bitlines and relevant global bitlines; a reference bitline controller having a reference sense amplifier formed either above or below the main cell array for sensing a signal provided through one of the one pair of reference global bitlines, to provide a reference voltage; a main bitline controller having a plurality of main sense amplifiers each formed on one side of the reference bitline controller and connected to one of the main global bitlines for receiving the reference voltage to sense a signal provided through a relevant global bitline; and a split wordline driver formed on one side of the main cell array, thereby equalizing numbers required to access to the main cell and the reference cell, whereby improving device operation characteristics and prolong a device lifetime.

17 Claims, 27 Drawing Sheets

E : electric field
P : polarity

NONVOLATILE FERROELECTRIC MEMORY DEVICE HAVING GLOBAL AND LOCAL BITLINES AND SPLIT WORKLINE DRIVER

BACKGROUND OF THE INVENTION

1. Field of the Invention

The present invention relates to a semiconductor memory, and more particularly, to a non-volatile ferroelectric memory.

2. Background of the Related Art

The ferroelectric memory, i.e., an FRAM (Ferroelectric Random Access Memory), having in general a data processing speed similar to a DRAM (Dynamic Random Access Memory) used widely as a semiconductor memory and being capable of conserving data even if the power is turned off, is paid attention as a next generation memory. The FRAM, a memory having a structure similar to the DRAM, is provided with a capacitor of a ferroelectric material for utilizing a high residual polarization of the ferroelectric material. The residual polarization permits the conservation of a data even after removal of an electric field.

FIG. 1 illustrates a characteristic curve of a hysteresis loop of a general ferroelectric material.

Referring to FIG. 1, it can be known that a polarization induced by an electric field is, not erased, but, certain amount ('d' and 'a' states) of which is remained, even if the electric field is removed owing to existence of the residual polarization (or spontaneous polarization). The 'd' and 'a' states are corresponded to '1' and '0' respectively in application to memories.

A related art non-volatile ferroelectric memory will be explained with reference to the attached drawings. FIG. 2 illustrates a system of unit cell of the related art non-volatile ferroelectric memory.

Referring to FIG. 2, the system of unit cell of the related art non-volatile ferroelectric memory is provided with a bitline B/L formed in one direction, a wordline W/L formed in perpendicular to the bitline, a plateline P/L formed spaced from the wordline in a direction identical to the wordline, a transistor T1 having a gate connected to the wordline and a source connected to the bitline, and a ferroelectric capacitor FC1 having a first terminal connected to a drain of the transistor T1 and a second terminal connected to the plateline P/L.

A circuit for driving the related art ferroelectric memory will be explained. FIGS. 3A and 3B illustrate a circuit for driving the related art ferroelectric memory.

The circuit for driving the related art ferroelectric memory of an 1T/1C structure is provided with a reference voltage generator 1 for generating a reference voltage, a reference voltage stabilizer 2 having a plurality of transistors Q1~Q4 and a capacitor C1 for stabilizing reference voltages on adjacent two bitlines, a first reference voltage storage 3 having a plurality of transistors Q6~Q7, and capacitors C2–C3 for respectively storing logical values of "1" and "0" on adjacent bitlines, a first equalizer 4 having a transistor Q5 for equalizing adjacent two bitlines, a first main cell array 5 connected to wordlines and platelines different from each other for storing data, a first sense amplifier 6 having a plurality of transistors Q10~Q15, a P-sense amplifier PSA for sensing data in cells selected by the wordline among the plurality of cells in the first main cell array 5, a second main cell array 7 connected to wordlines and platelines different from one another for storage of data, a second reference voltage storage 8 having a plurality of transistors Q28~Q29 and capacitors C9~C10 for storing reference voltages with logical values of "1" and "0" on adjacent bitlines, and a second sense amplifier 9 having a plurality of transistors Q16~Q25, N-sense amplifier NSA for sensing and forwarding a data in the second main array 7.

The data input/output operation of the related art ferroelectric memory will be explained. FIG. 4 illustrates a timing diagram of a write mode operation of the related art ferroelectric memory, and FIG. 5 illustrates a timing diagram of a read mode operation of the related art ferroelectric memory.

In writing, when an external chip enable signal CSB pad is enabled from 'high' to 'low' and a write enable signal WEBpad is applied from 'high' to 'low' on the same time, a write mode is started. When address decoding is started in the write mode, a pulse applied to a relevant wordline is transited from 'low' to 'high' to select a cell. Thus, in an interval the wordline is held 'high', a relevant plateline is applied of a 'high' signal for one interval and a 'low' signal for the other interval in succession. And, in order to write a logical value '1' or '0' on the selected cell, a 'high' or 'low' signal synchronized to the write enable signal WEBpad is applied to a relevant bitline. That is, if a 'high' signal is applied to the bitline and a signal applied to the plateline is 'low' in an interval in which a signal applied to the wordline is 'high', a logical value '1' is written on the ferroelectric capacitor. And, if a 'low' signal is applied to the bitline and a signal applied to the plateline is 'high', a logical value '0' is written on the ferroelectric capacitor.

The operation for reading the data stored in the cell by the aforementioned write mode operation will be explained.

If the chip enable signal CSBpad is enabled from 'high' to 'low' externally, all bitlines are equalized to a 'low' voltage before a relevant wordline is selected. That is, referring to FIGS. 3A and 3B, if a 'high' signal is applied to the equalizer 4 and a 'high' signal is applied to the transistors Q18 and Q19, as the bitlines are grounded through the transistor Q19, the bitlines are equalized to a low voltage Vss. And, the transistors Q5, Q18, and Q19 are turned off, to disable the bitlines, an address is decoded, and the decoded address causes a 'low' signal on a relevant wordline to transit to a 'high' signal, to select a relevant cell. A 'high' signal is applied to the plateline of the selected cell, to break a data corresponding to a logical value '1' stored in the ferroelectric memory. If a logical value '0' is in storage in the ferroelectric memory, a data corresponding to the logical value '0' is not broken. The data not broken and the data broken provide values different from each other according to the aforementioned hysteresis loop, so that the sense amplifier senses a logical value '1' or '0'. The case of the data broken is a case when the value is changed from 'd' to 'f' in the hysteresis loop of FIG. 1, and the case of the data not broken is a case when the value is changed from 'a' to 'f' in the hysteresis loop of FIG. 1. Therefore, if the sense amplifier is enabled after a certain time period is passed, in the case of the data broken, a logical value '1' is provided as amplified, and in the case of the data not broken, a logical value '0' is provided. After the sense amplifier provides data thus, in order to restore an original data, the plateline is disabled from 'high' to 'low' in a state a 'high' signal is applied to a relevant wordline. In the related art ferroelectric memory of an 1T/1C structure, data input/output operations of the reference cell require much more operation than the operations of the main cell.

The aforementioned related art ferroelectric memory has the following problem.

The use of one reference cell in reading main cells of a number a few hundred times. greater than the reference cell under a state a ferroelectric characteristic is not assured adequately, that requires the reference cell much more operation than the main cells, causes a rapid degradation of the reference cell, resulting in a voltage instability, device operation characteristics deterioration, and short lifetime.

SUMMARY OF THE INVENTION

Accordingly, the present invention is directed to a nonvolatile ferroelectric memory that substantially obviates one or more of the problems due to limitations and disadvantages of the related art.

An object of the present invention is to provide anonvolatile ferroelectric memory which has improved operation characteristics.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the nonvolatile ferroelectric memory includes a main cell array having a plurality of sub cell arrays, a plurality of main global bitlines and at least one pair of reference global bitlines formed across the sub cell arrays, main local bitlines and reference local bitlines formed in correspondence to the main global bitlines and the reference global bitlines, and switches provided between local bitlines and relevant global bitlines; a reference bitline controller having a reference sense amplifier formed either above or below the main cell array for sensing a signal provided through one of the one pair of reference global bitlines, to provide a reference voltage; a main bitline controller having a plurality of main sense amplifiers each formed on one side of the reference bitline controller and connected to one of the main global bitlines for receiving the reference voltage to sense a signal provided through a relevant global bitline; and a split wordline driver formed on one side of the main cell array.

In other aspect of the present invention, there is provided a nonvolatile ferroelectric memory including a main cell array having a plurality of sub cell arrays, a plurality of main global bitlines and at least one pair of reference global bitlines formed across the sub cell arrays, main local bitlines and reference local bitlines formed in correspondence to the main global bitlines and the reference global bitlines, and switches provided between local bitlines and relevant global bitlines; a first reference bitline controller having a first reference sense amplifier formed above the main cell array for sensing a signal provided through one of the one pair of reference global bitlines, to provide a first reference voltage; a second reference bitline controller having a second reference sense amplifier formed below the main cell array for providing a second reference voltage identical to the first reference voltage; a first main bitline controller having main sense amplifiers each formed on one side of the first reference bitline controller and connected to even numbered main global bitlines for receiving the first reference voltage to sense a signal provided through a relevant global bitline; a second main bitline controller having main sense amplifiers each formed on one side of the second reference bitline controller and connected to odd numbered main global bitlines for receiving the second reference voltage to sense a signal provided through a relevant global bitline; and a split wordline driver formed on one side of the main cell array.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
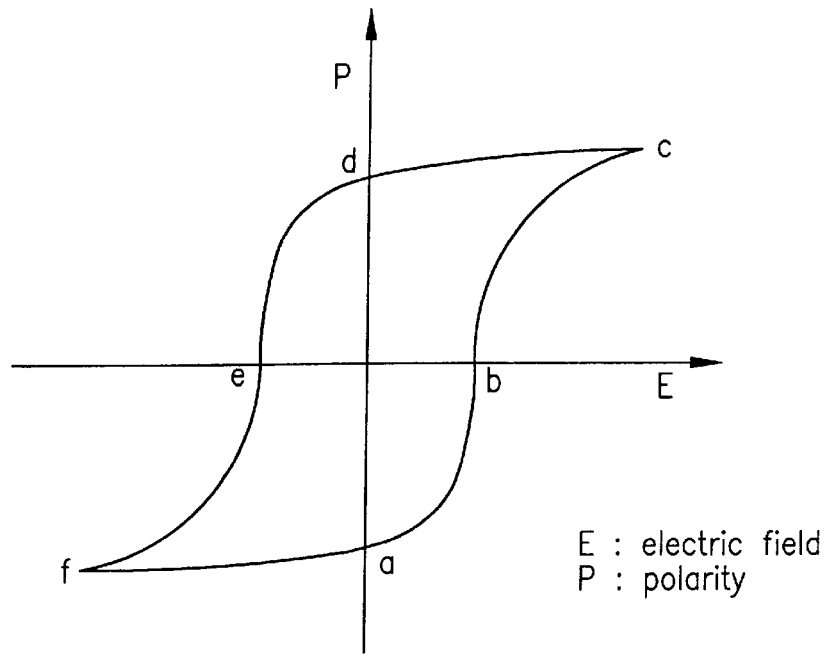
FIG. 1 illustrates a characteristic curve of a general ferroelectric hysteresis loop.
Figure 2:
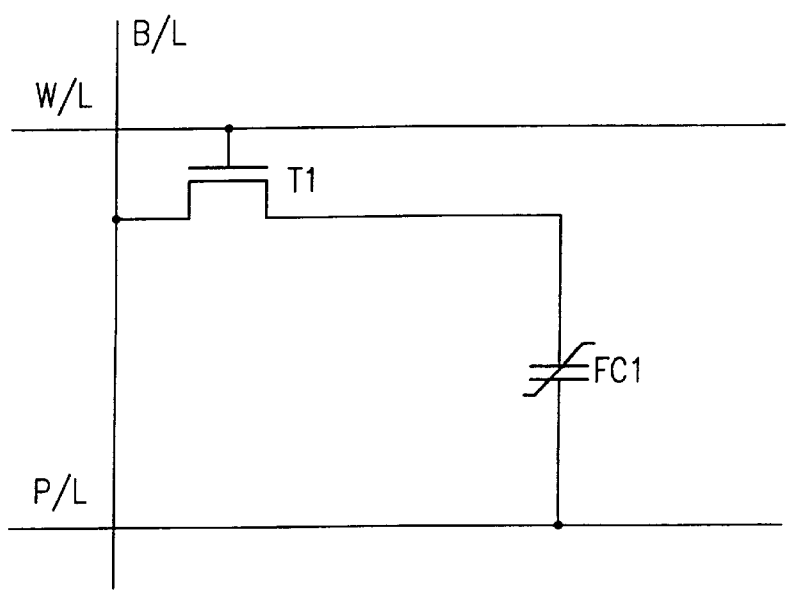
FIG. 2 illustrates a system of unit cell of a related art nonvolatile ferroelectric memory.
Figure 3A:
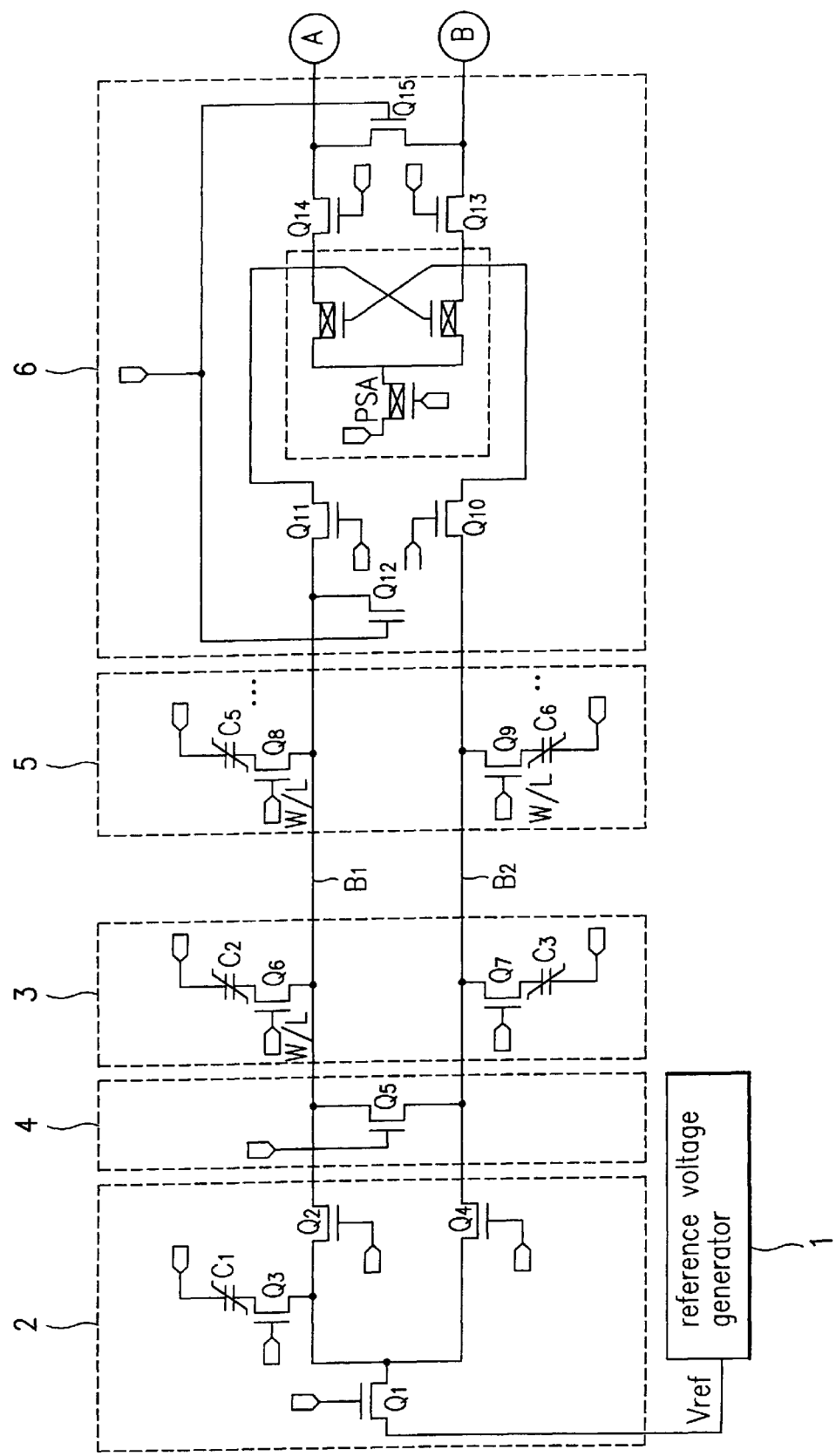
FIGS. 3A and 3B illustrate a driving circuit for driving a related art ferroelectric memory.
Figure 3B:
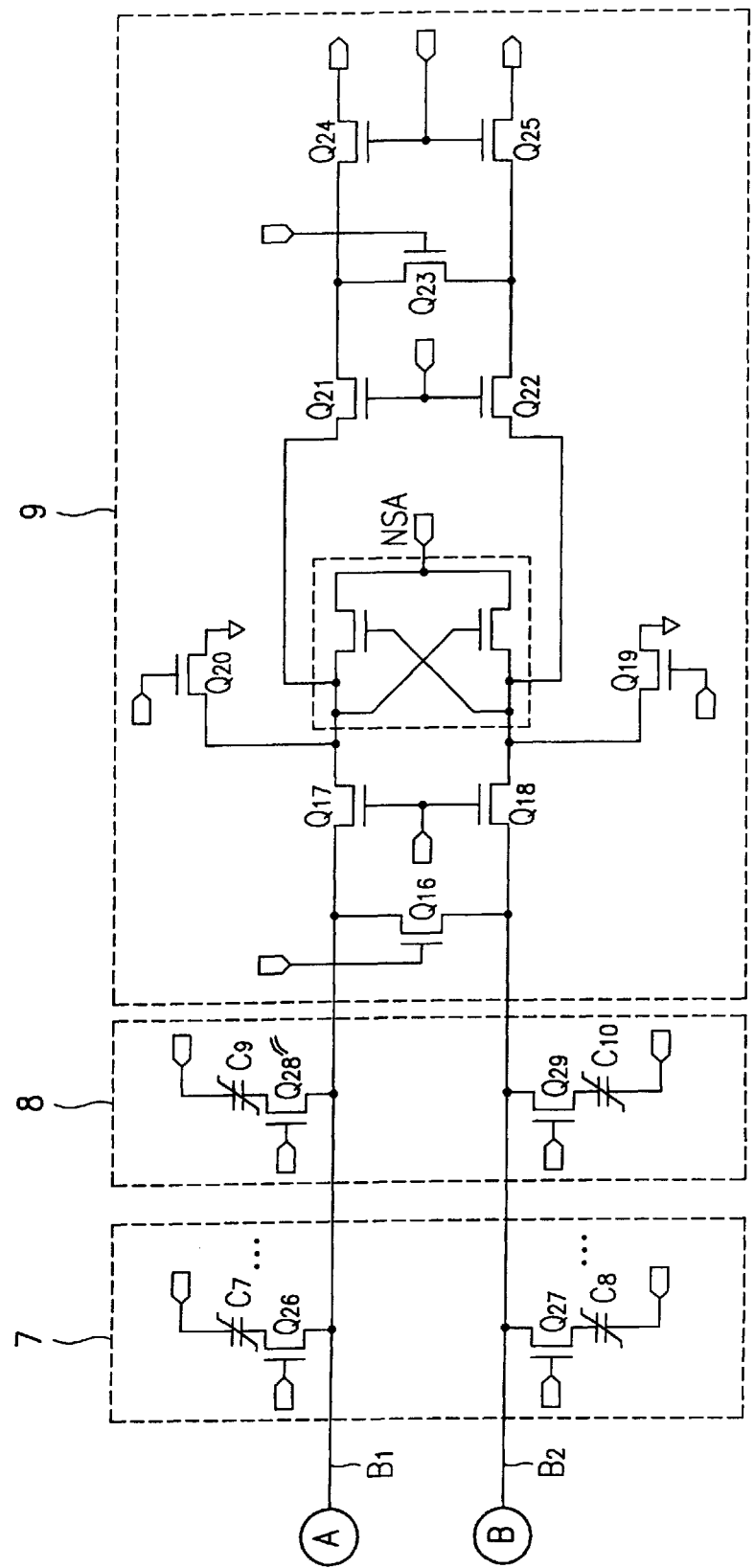
Figure 4:
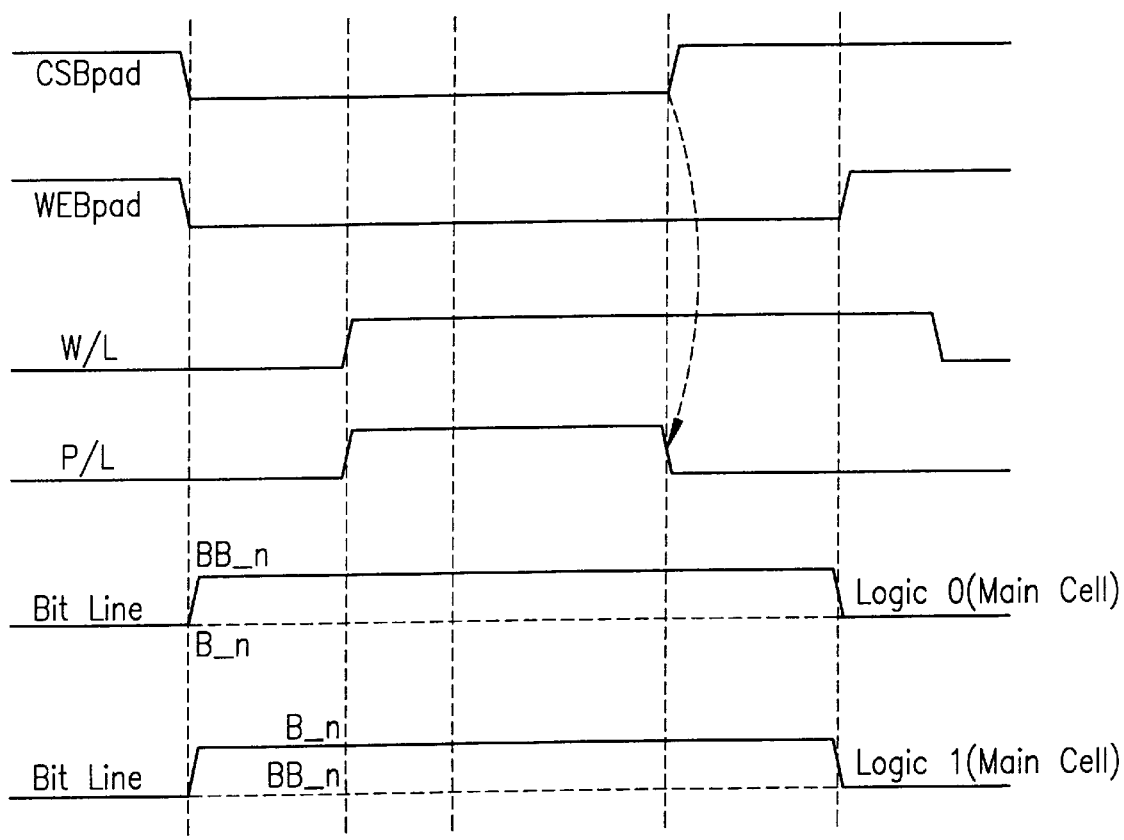
FIG. 4 illustrates a write mode timing diagram of the related art ferroelectric memory.
Figure 5:
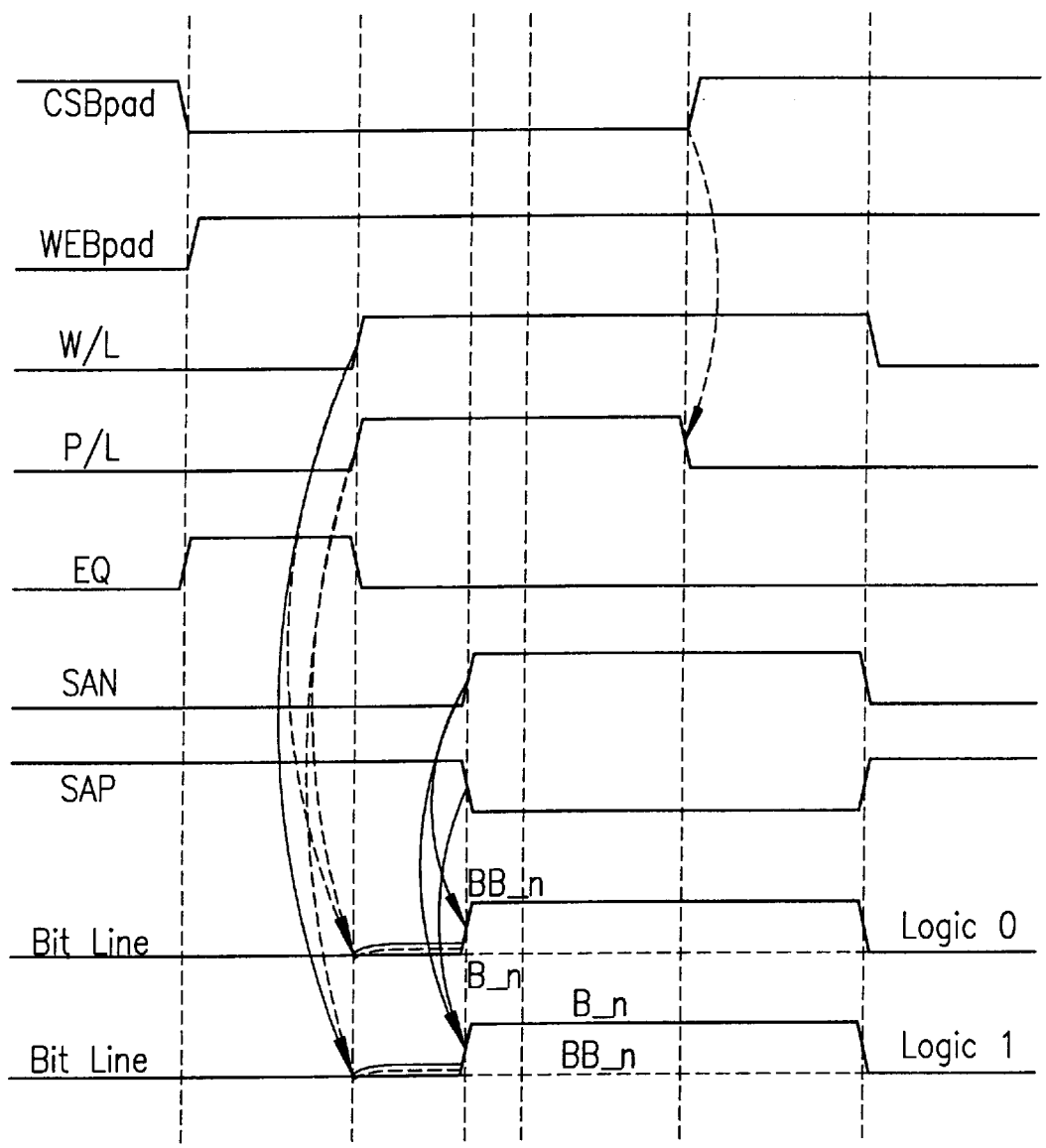
FIG. 5 illustrates a read mode timing diagram of the related art ferroelectric memory.
Figure 6:
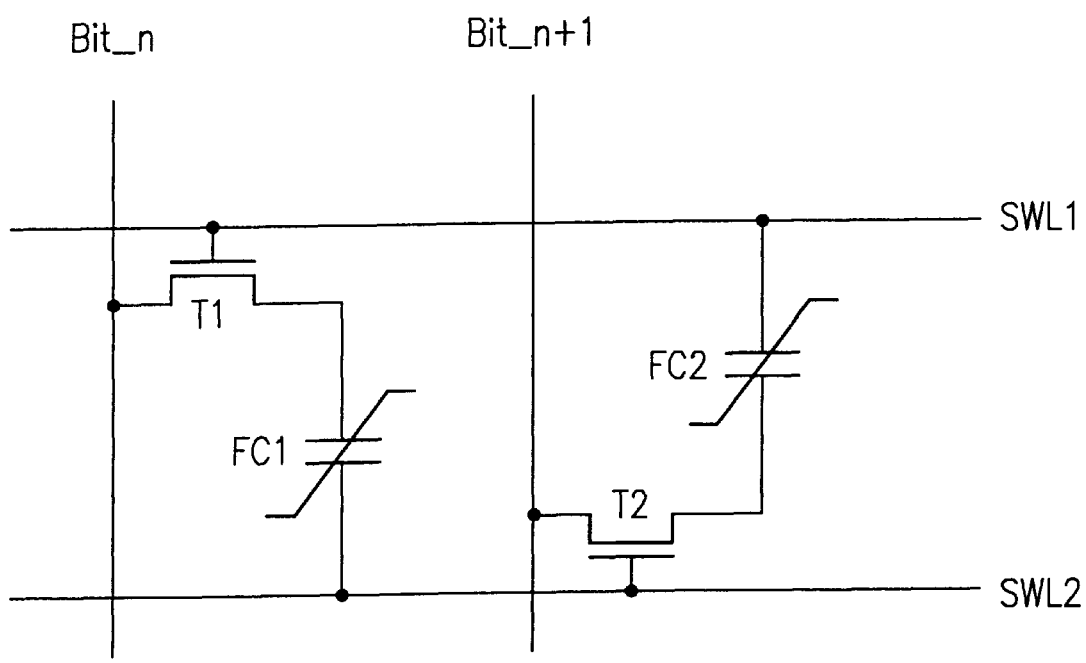
FIG. 6 illustrates a two unit cell system of a nonvolatile ferroelectric memory in accordance with a preferred embodiment of the present invention.

Reference will now be made in detail to the preferred embodiments of the present invention, examples of which are illustrated in the accompanying drawings. FIG. 6 illustrates a two unit cell system of a nonvolatile ferroelectric memory in accordance with a preferred embodiment of the present invention.

Referring to FIG. 6, the two unit cell system of a nonvolatile ferroelectric memory includes a first split wordline SWL1 formed in one direction, a second split wordline SWL2 formed in parallel to the first split wordline SWL1, a first bitline Bit_n and a second bitline Bit_n+1 perpendicular to the split wordlines SWL1 and SWL2 spaced from each other, a first switching transistor T1 having a gate terminal connected to the first split wordline SWL1, a source terminal connected to the first bitline Bit_n, and a drain connected to one side terminal of a first ferroelectric capacitor FC1 (the other side terminal of the first ferroelectric capacitor FC1 is connected to the second split wordline SWL2), and a second switching transistor T2 having a gate terminal connected to the second split wordline SWL2, a source terminal connected to the second bitline Bit_n+1, and a drain terminal connected to one side terminal of the second ferroelectric capacitor FC2. Thus, the nonvolatile ferroelectric memory of the present invention includes two split wordlines, two bitlines, and two switching transistors and two ferroelectric capacitors disposed between the bitlines and the wordlines.

Figure 7A:
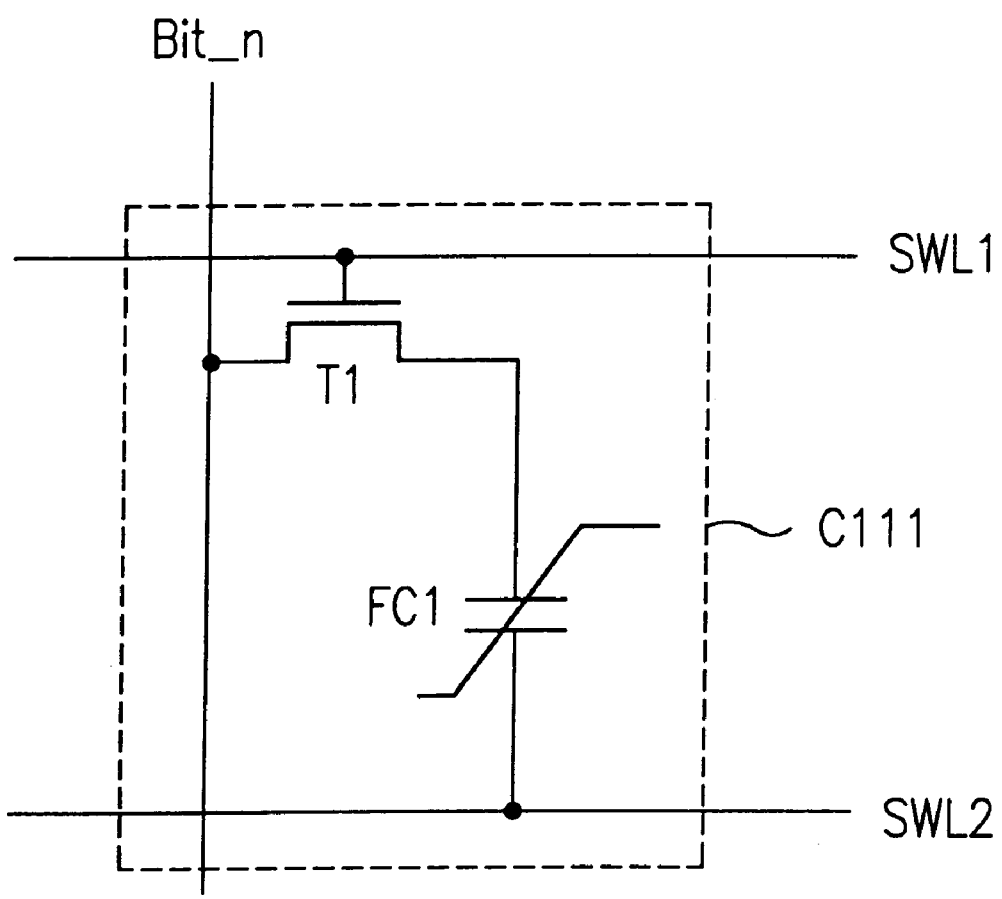
FIGS. 7A and 7B illustrate the two unit cell system in FIG. 6 divided into 1T/1C unit cells.
Figure 7B:
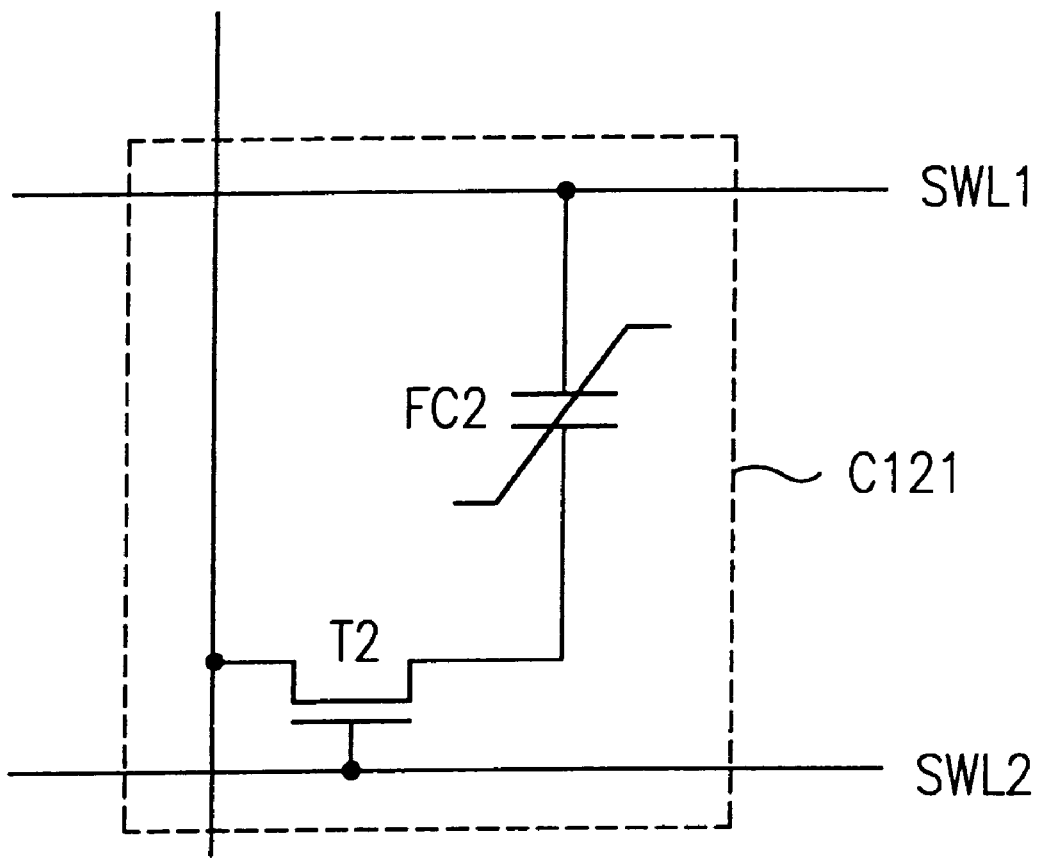

FIGS. 7A and 7B illustrate the two unit cell system in FIG. 6 divided into 1T/1C unit cells, combination of which form a memory having one pair of unit cells.

Referring to FIG. 7A, one unit cell C111 in one pair of memory cells includes a first split wordline SWL1, a second split wordline SWL2 arranged in parallel to the first split wordline SWL1, a first bitline Bit_n arranged perpendicular to the first and second split wordlines SWL1 and SWL2, a first transistor T1 having a gate terminal connected to the first split wordline SWL1 and a source terminal connected to the first bitline Bit_n, and a first ferroelectric capacitor FC1 between a drain terminal of the first transistor T1 and the second split wordline SWL2. As shown in FIG. 7B, the other unit cell C121 includes a first split wordline SWL1, a second split wordline SWL2 arranged in parallel to the first split wordline SWL1, a second bitline Bit_n+1 arranged perpendicular to the first and second split wordlines SWL1 and SWL2, a second transistor T2 having a gate terminal connected to the second split wordline SWL2 and a source terminal connected to the second bitline Bit_n+1, and a second ferroelectric capacitor FC2 between a drain terminal of the second transistor T2 and the first split wordline SWL1. Thus, the nonvolatile memory cell array of the present invention has pairs of the unit cells shown in FIGS. 7A and 7B arranged repetitively and continuously.

Figure 8A:
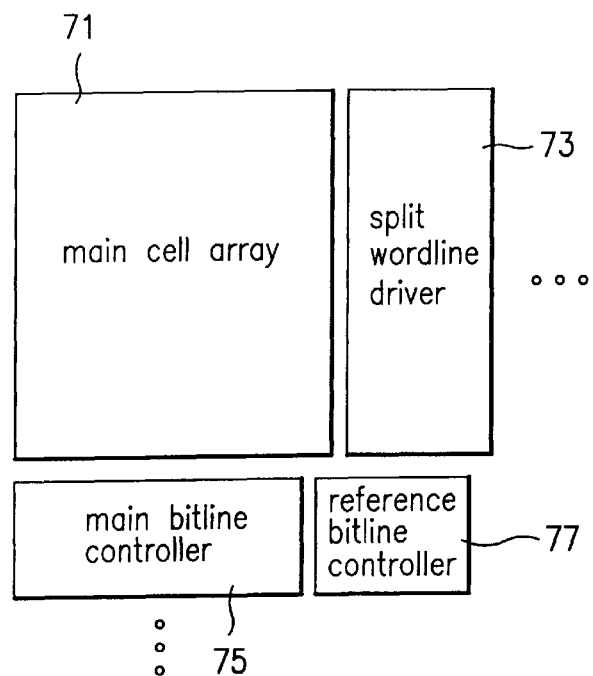
FIG. 8A illustrates a block diagram of a cell array of the nonvolatile ferroelectric memory in accordance with a first preferred embodiment of the present invention.

The aforementioned nonvolatile memory cell array of the present invention having pairs of the unit cells will be explained in detail. FIG. 8A illustrates a block diagram of a cell array of the nonvolatile ferroelectric memory in accordance with a first preferred embodiment of the present invention.

Figure 8B:
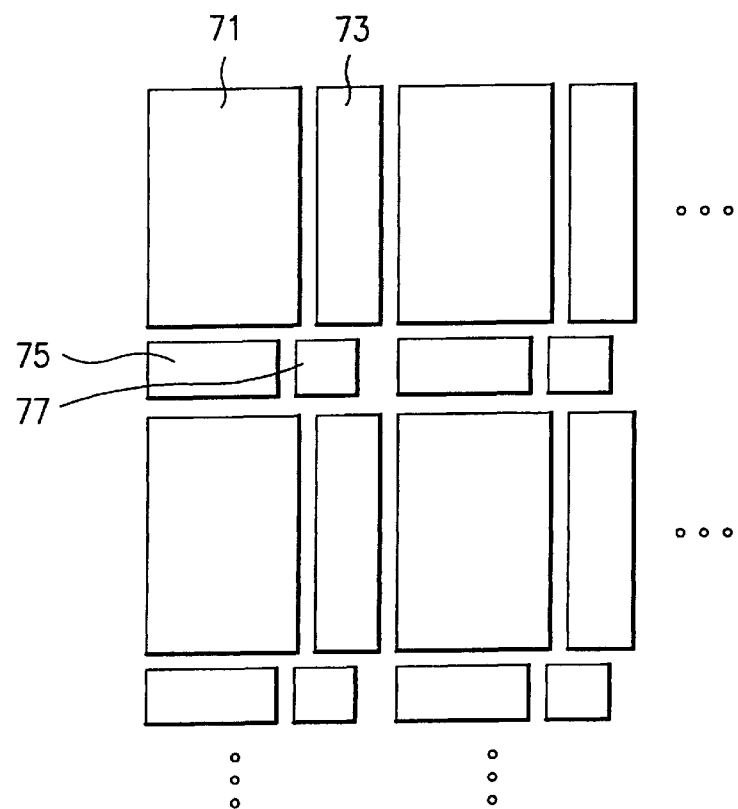
FIG. 8B illustrates a block diagram of a cell array of the nonvolatile ferroelectric memory when the cell array in FIG. 8A is repeated.

Referring to FIG. 8a, the cell array of the nonvolatile ferroelectric memory includes a main cell array 71, a split wordline driver 73 formed on one side of the main cell array 71, a main bitline controller 75 formed under the main cell array 71, and a reference bitline controller 77 formed on one side of the main bitline controller 75. The main cell array 71 in turn includes a plurality of cell arrays internally. Repetitive arrangement of the system shown in FIG. 8A leads to a system as shown in FIG. 8B.

Figure 9:
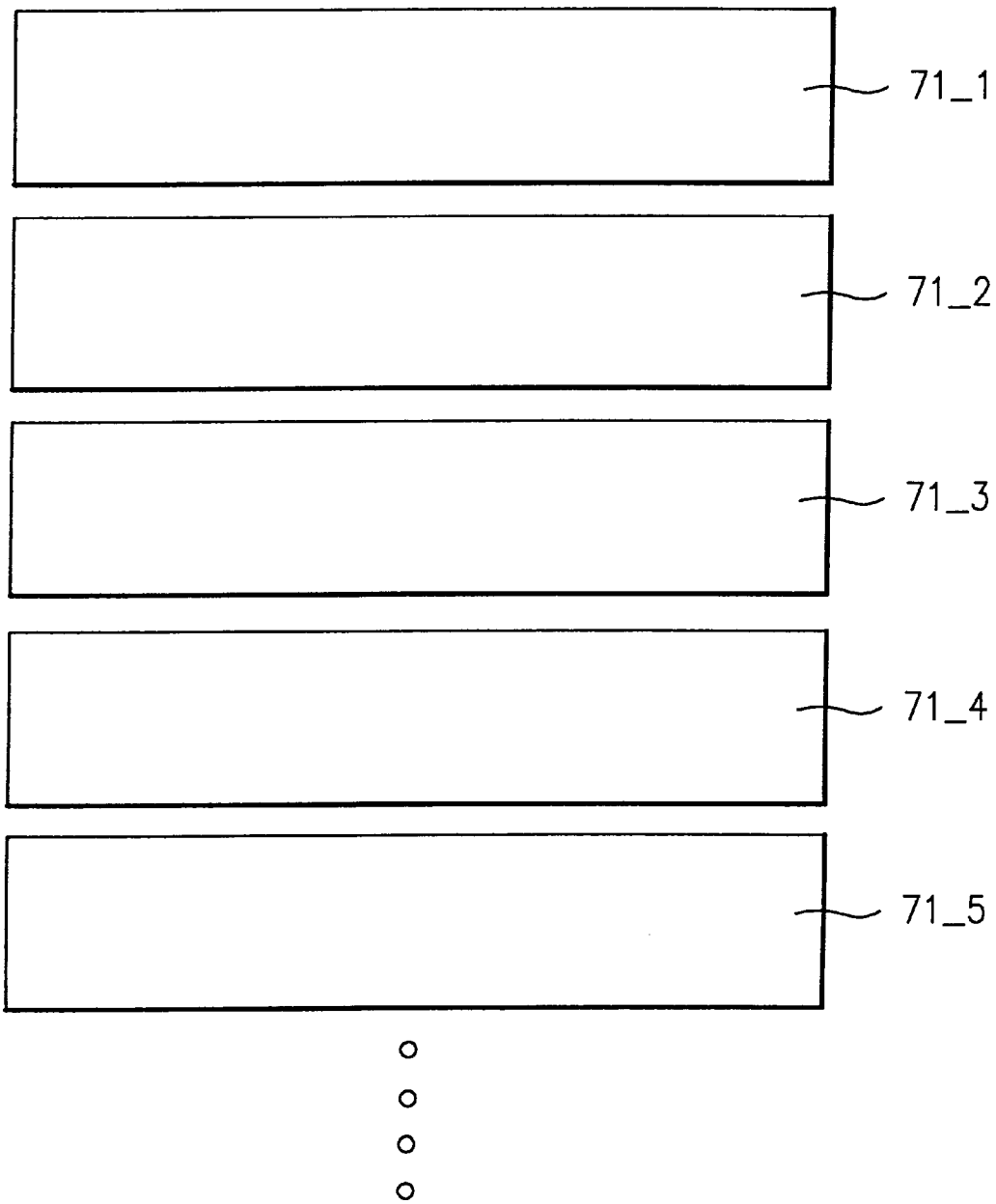
FIG. 9 illustrates a detailed system of a main cell array of the present invention.

In the meantime, FIG. 9 illustrates a detailed system of a main cell array of the present invention, inclusive of a plurality of cell arrays (called "sub cell array") as explained before.

There is only one enabled sub cell array among the plurality of sub cell arrays 71_1, 71_2, 71_3, - - -, 71_n.

Figure 10:
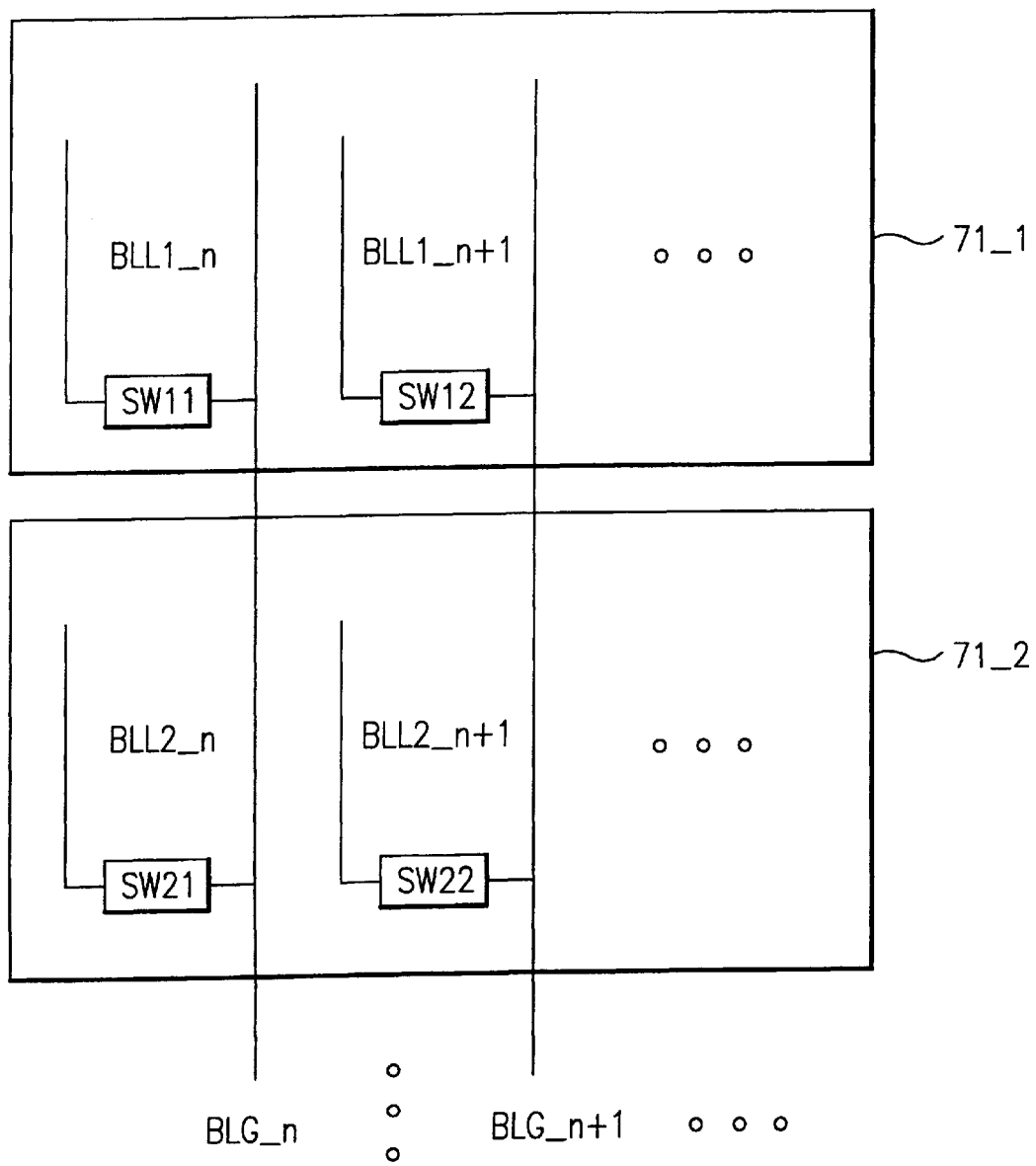
FIG. 10 illustrates a detailed system of the main cell array in FIG. 9.

FIG. 10 illustrates a detailed system of the main cell array in FIG. 9.

Referring to FIG. 10, there are a plurality of global bitlines BLG_n, BLG_n+1, - - - across each of the sub cell arrays. And, there are local bitlines BLL1_n, - - -, BLLn_n in each of the sub cell arrays 71_1, 71_2, - - - in correspondence to the global bitlines BLG_n, BLG_n+1, - - - . That is, there are switches SWL11, SWL12, - - - , SW1n/SWL21, SWL22, - - - , SW2n/SWLn1, SWL nn provided between each of the local bitlines and the global bitlines for electrical connection between the local bitlines and the global bitlines.

Figure 11:
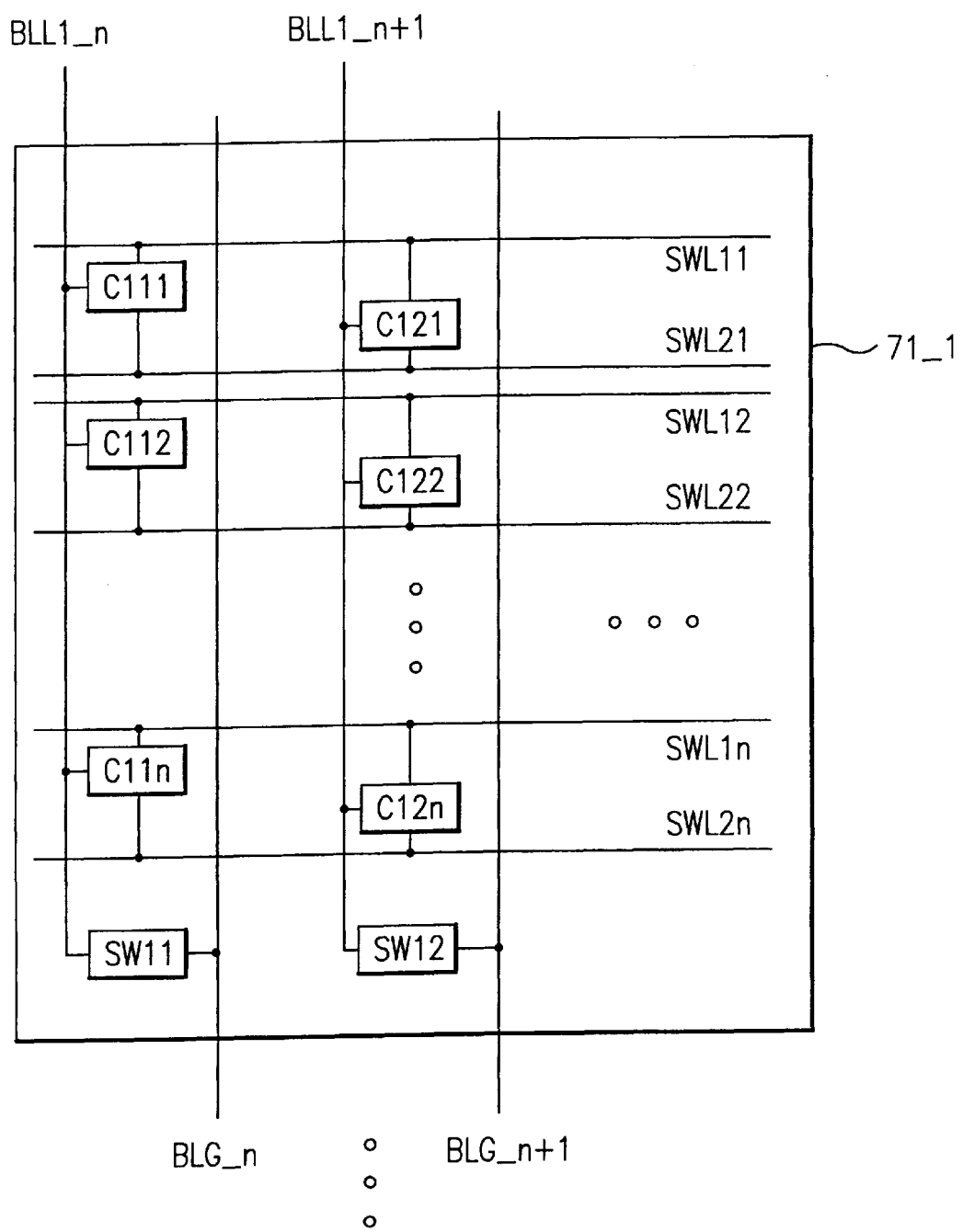
FIG. 11 illustrates a detailed system of a sub cell array of the present invention.

FIG. 11 illustrates a detailed system of a sub cell array of the present invention.

Referring to FIG. 11, the sub cell array includes a plurality of pairs of the first split wordline SWL1 and the second split wordline SWL2 arranged repetitively. There are a plurality of global bitlines BLG_n, BLG_n+1, - - - perpendicular to the pairs of the split wordlines SWL1 and SWL2, of which two global bitlines BLG_n, BLG_n+1 form, wherein the global bitline BLG_n has the unit cells C111, C112, - - - , C11n shown in FIG. 7A connected thereto and the other global bitline BLG_n+1 has the unit cells C121, C122, - - - , C12n as shown in FIG. 7B connected thereto. Thus, the sub cell array 71_1 includes pairs of memory cells inclusive of two global bitlines BLG_n, and BLG_n+1, two split wordlines SWL1 and SWL2, two switching transistors T1 and T2, and two ferroelectric capacitors FC1 and FC2, arranged repetitively.

The process for selecting a cell in the aforementioned sub cell array will be explained.

As has been explained, as shown in FIG. 11, the main cell array includes the sub cell array arranged repetitively. Of the plurality of sub cell arrays, only one sub cell array is enabled, and, particularly, only one pair of split wordlines are enabled. Therefore, once one pair of split wordlines are enabled, a data stored in the unit cell connected to the enabled split wordlines is transferred to a relevant global bitline through a relevant local bitline. Data transferred through respective local bitlines are provided to the plurality of global bitlines, which are in turn connected to the enabled split wordlines, to transfer the data to the bitline controller (not shown). As explained, the bitline controller has sense amplifiers (not shown) each connected to the global bitline. Accordingly, a data from only one of the plurality of sense amplifiers is presented through a dataline.

Figure 12:
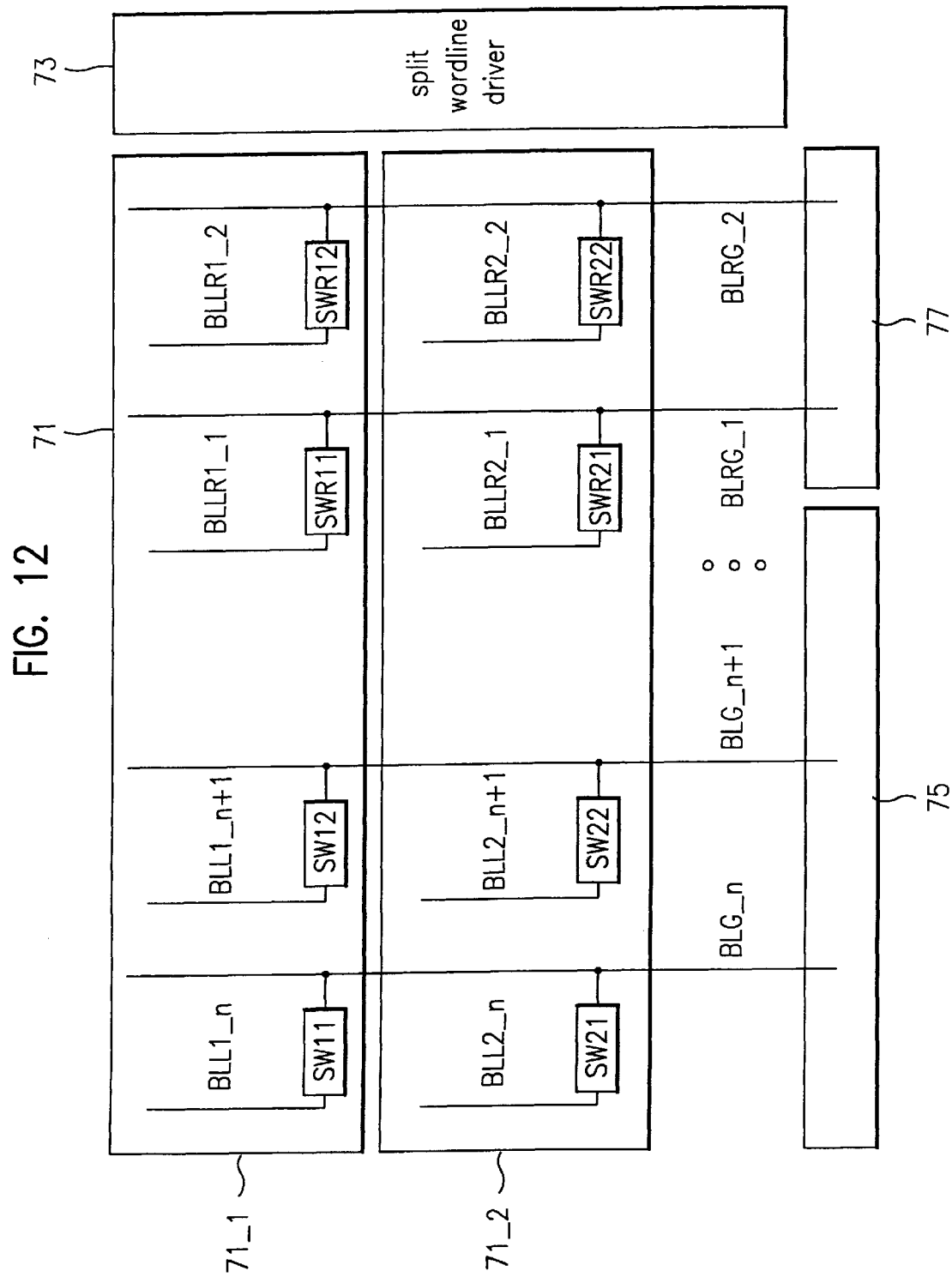
FIG. 12 illustrates a detailed system of the cell array in FIG. 8A.

FIG. 12 illustrates a detailed system of the cell array in FIG. 8A, wherein, as explained, the main cell array 71 includes a plurality of sub cell arrays 71_1, 71_2, - - - . And, the main global bitlines BLG_n, BLG_n+1, - - - across the main cell arrays 71_1, 71_2, - - - are connected to the main bitline controller 75, and the reference global bitlines BLRG_1 and BLRG_2 are connected to the reference bitline controller 77. The reference bitline controller 77 takes two reference global bitlines BLRG_1 and BLRG_2. As shown, each sub cell array has main local bitlines in correspondence to the main global bitlines. For example, a first main global bitline BLG_n is provided with a plurality of main local bitlines BLL1_n, BLL2_n, - - - . And, switches SW11, SW21, - - - are provided between the main local bitlines and the main global bitlines. There are reference local bitlines BLLR1_1, BLLR1_2/BLLR2_1, BLLR2_2/, - - - /BLLRn_1, BLLRn_2 in correspondence to the reference global bitlines BLRG_1, BLRG_2. And, there are switches SWR11, SW12/SW21, SW22/SWRn1, SWn2 between the reference local bitlines and the reference global bitlines BLRG_1 and BLRG_2. Accordingly, any one of the plurality of sub cell arrays 71_1, 71_2, - - - is selected, and the main local bitline in a relevant sub cell array is connected to the main global bitline, to transfer a data to the main bitline controller, finally. Alikely, the reference local bitline in a sub cell array is connected to a relevant reference global bitline, to transfer a data to the reference bitline controller 77, finally.

Figure 13:
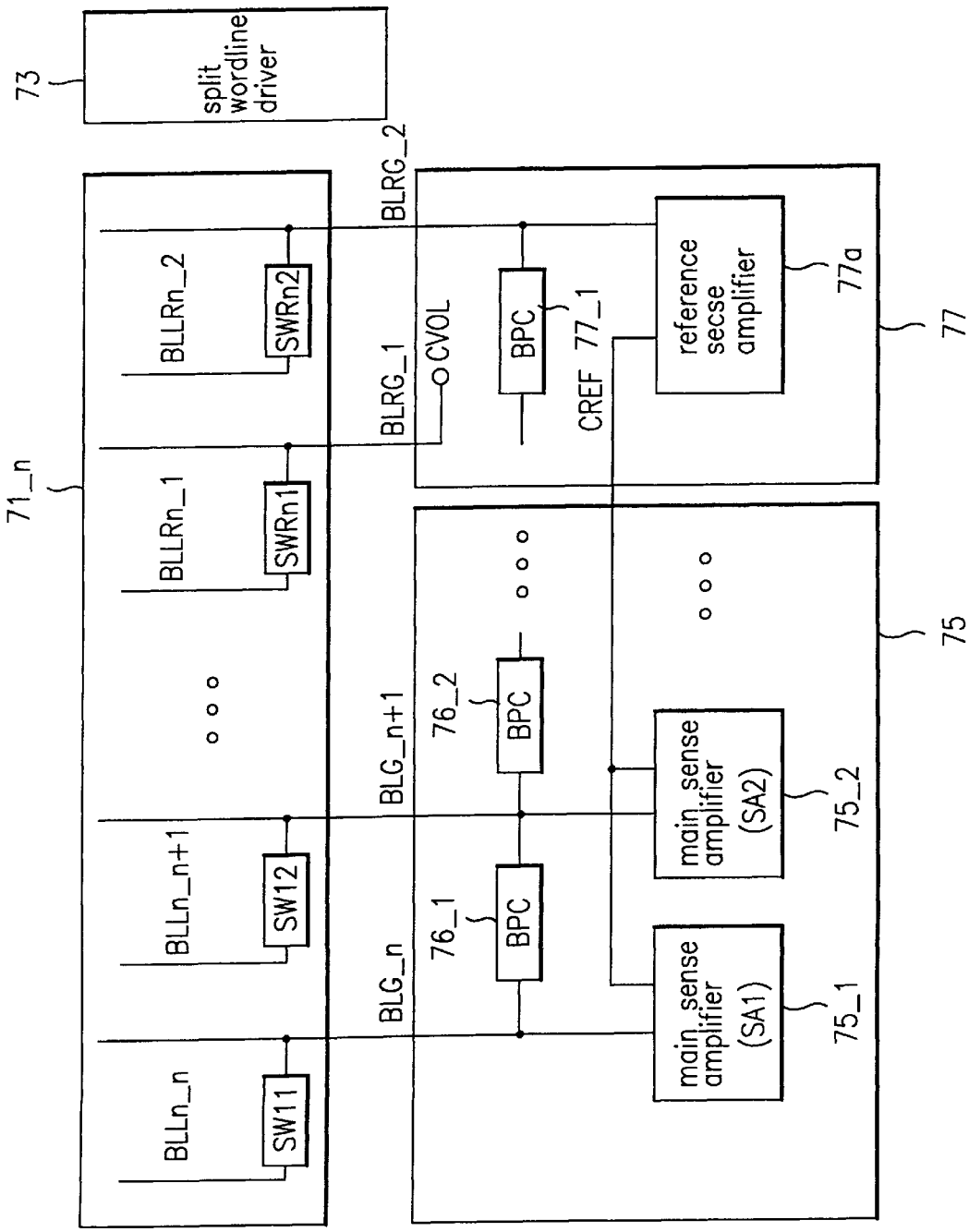
FIG. 13 illustrates a detailed system of the cell array in FIG. 8A centered on the main bitline controller and the reference bitline controller.

In the meantime, FIG. 13 illustrates a detailed system of the cell array in FIG. 8A centered on the main bitline controller and the reference bitline controller.

Referring to FIG. 13, there are main sense amplifiers SA1, SA2, - - - 75_1, 75_2, - - - in correspondence to the main global bitlines BLG_n, BLG_n+1, - - - . Of the two reference global bitlines BLRG_1 and BLRG_2, one is connected to the reference sense amplifier 77a, a reference voltage CREF from which is provided to all the main sense amplifiers 75_1, 75_2, - - - . There are BPC (Bitline Precharge Circuit) 76_1, 76_2, - - - , between adjacent main global bitlines BLG_n and BLG_n+1, or BLG_n+1 and BLG_n+2, - - - . There is also a bitline precharge circuit 77_1 between the last main global bitline BLG_n+n and the reference global bitline BLRG_2 connected to the reference sense amplifier 77a. And, a constant voltage is applied to one reference global bitline BLRG_1 not connected to the reference sense amplifier 77a.

Figure 14:
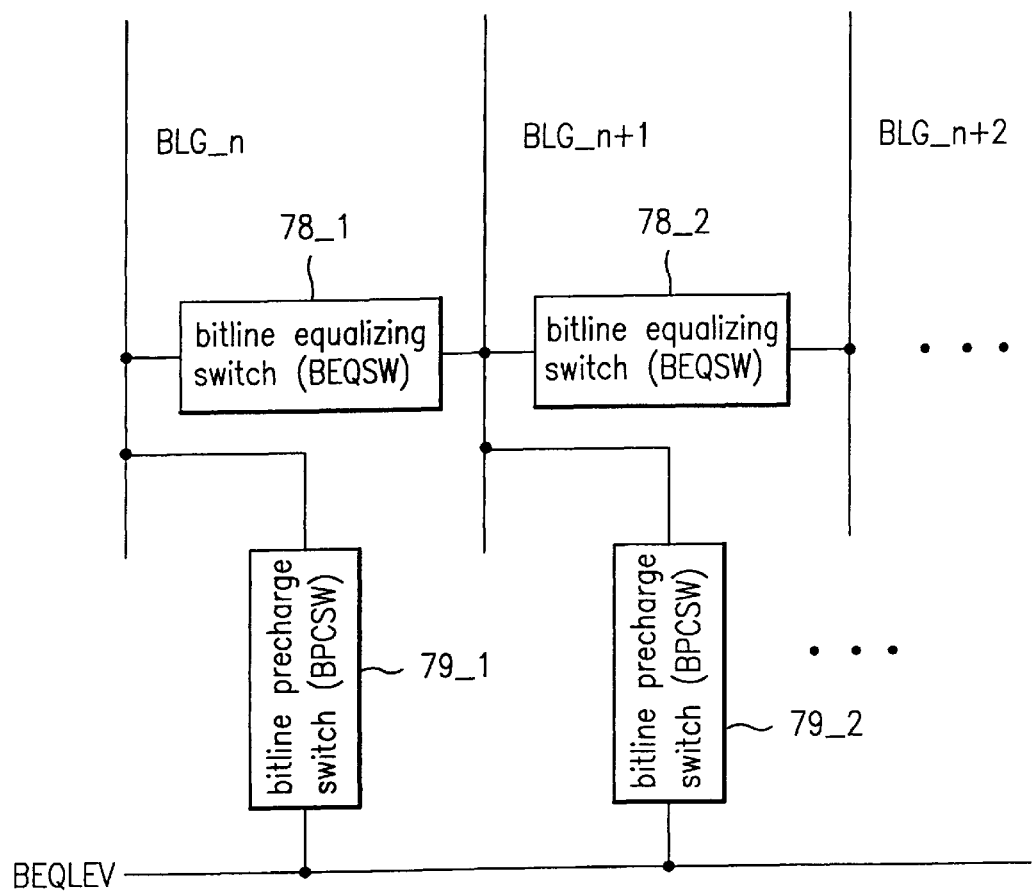
FIG. 14 illustrates a detailed system of the bitline precharge circuit in accordance with a first preferred embodiment of the present invention.

FIG. 14 illustrates a detailed system of the bitline precharge circuit in accordance with a first preferred embodiment of the present invention.

Referring to FIG. 14, the bitline precharge circuit includes a plurality of global bitlines BLG_n, and BLG_n+1, - - - , bitline equalizing switches BQESW 78_1, 78_2, - - - between the global bitlines BLG_n, BLG_n+1, - - - , and a plurality of bitline precharge switches BPCSW 79_1, 79_2, - - - for switching a signal BEQLEV from a bitline precharge level supplier (not shown) to each of the global bitlines BLG_n, BLG_n+1, - - - . Each of the bitline equalizing switches 78_1, 78_2, - - - and the bitline precharge switches 79_1, 79_2, - - - includes an NMOS transistor. Therefore, a level of the signal from the bitline precharge level supplier is equal to or slightly higher than a threshold voltage of the NMOS transistor. At the end, the signal for the bitline precharge level supplier precharges a relevant global bitline level through the bitline precharge switches 79_1, 79_2, - - - . And, the bitline equalizing switches 78_1, 78_2, - - - are turned on in response to a switch control signal, to equalize adjacent two global bitlines.

Figure 15:
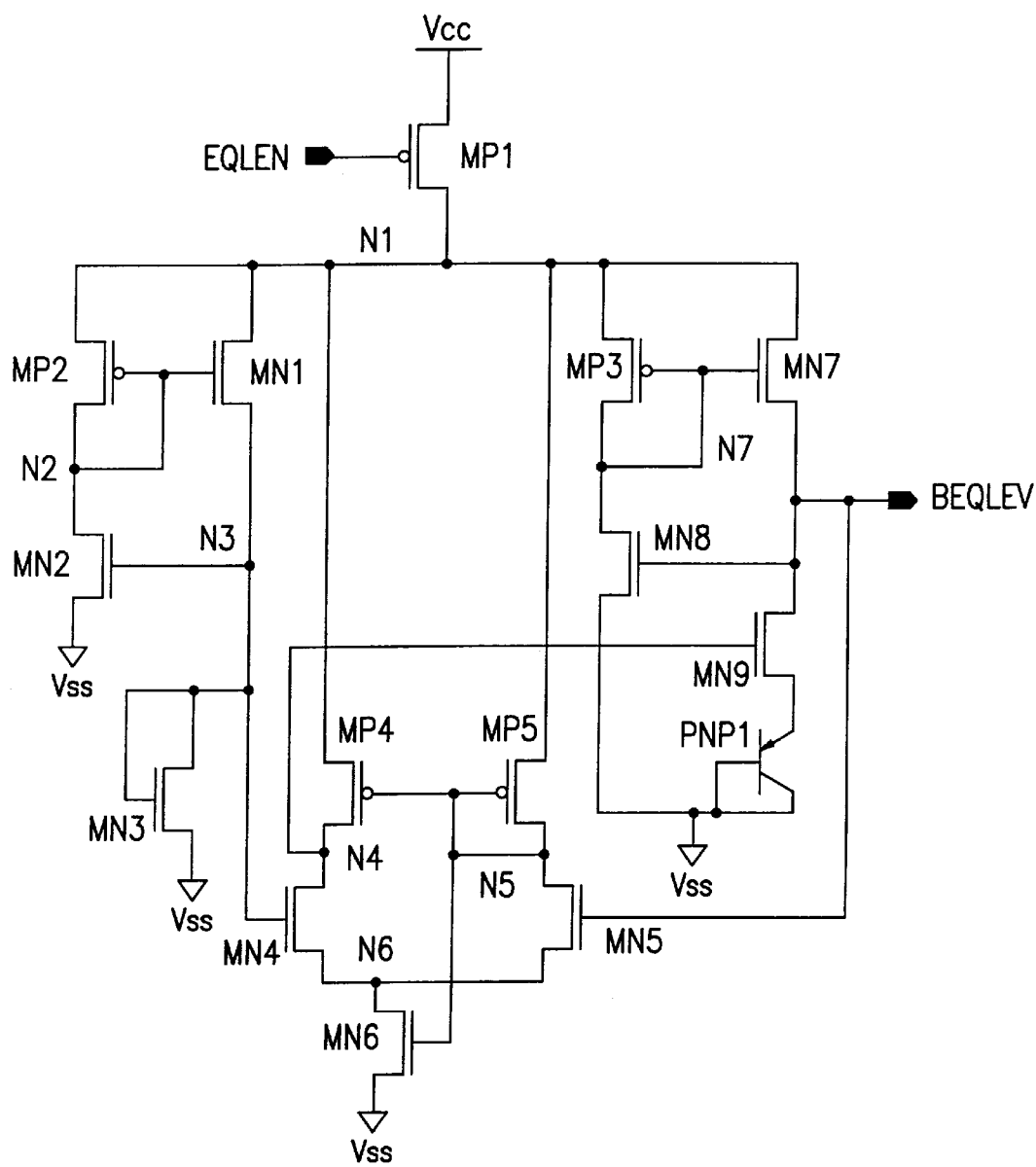
FIG. 15 illustrates a detailed system of a bitline precharge level supplier for supplying a bitline precharge level.

FIG. 15 illustrates a detailed system of a bitline precharge level supplier for supplying a bitline precharge level.

Referring to FIG. 15, the bitline precharge level supplier includes a first PMOS transistor MP1 having a source connected to a power source terminal Vcc and adapted to be controlled in response to an enable signal EQLEN for enabling the bitline precharge level supplier, a second PMOS transistor MP2 having a source connected to a drain of the first PMOS transistor MP1, and a drain and a gate connected together, a first NMOS transistor MN1 connected to a drain of the first PMOS transistor MP1 in parallel with the second PMOS transistor MP2 and having a gate connected to a gate of the second PMOS transistor MP2, a second NMOS transistor MN2 connected in series with the second PMOS transistor MP2 and having a gate connected to a drain of the second PMOS transistor MP2, a third NMOS transistor MN3 having a gate and a drain connected to a drain of the first NMOS transistor MN1 in common and a source connected to a ground terminal Vss, a fourth NMOS transistor MN4 having a gate connected to a drain of the first NMOS transistor MN1 for being controlled by a drain voltage of the first NMOS transistor MN1, a fifth NMOS transistor MN5 disposed opposite to the fourth NMOS transistor MN4 and having a drain connected to a drain of the fourth NMOS transistor MN4, a sixth NMOS transistor MN6 having a drain connected to a common drain of the fourth and fifth NMOS transistors MN4 and MN5 and a source connected to a ground terminal, a fourth PMOS transistor MP4 connected between a source of the fourth NMOS transistor MN4 and a drain of the first PMOS transistor MP1, a fifth PMOS transistor MP5 connected between a source of the fifth NMOS transistor MN5 and a drain of the first PMOS transistor MP1, a third PMOS transistor MP3 arranged in parallel with the first NMOS transistor MN1 with respect to a drain of the first PMOS transistor MP1 and having a drain and a gate connected together, a seventh NMOS transistor MN7 arranged opposite to the third PMOS transistor MP3 and having a gate connected to a gate of the third PMOS transistor MP3, an eighth NMOS transistor MN8 having a gate connected to a drain of the seventh NMOS transistor MN7, and a source connected to a drain of the third PMOS transistor MP3, a ninth NMOS transistor MN9 adapted to be controlled by a drain voltage of the fourth PMOS transistor MP4 and connected in series with the seventh NMOS transistor MN7, and a bipolar transistor PNP1 having an emitter connected to a drain of the ninth transistor MN9 and a collector and a base connected to a ground terminal in common. The fifth NMOS transistor MN5 is controlled by a bitline precharge voltage for precharging the bitline.

The operation of the aforementioned bitline precharge level supplier will be explained in detail.

Referring to FIG. 15, when an enable signal for the bitline precharge level supplier is transited to low, the first PMOS transistor MP1 is enabled to pull up a potential at a node N1 to a high level. If a voltage on a drain side of the second NMOS transistor MN2, i.e., a node N2 is at low initially, the second PMOS transistor MP2 is turned on, to pull up a level of the node N2, too. Consequently, the first NMOS transistor MN1 having the gate connected to the node N2 is turned on, to pull up a level of the node N3. When the level of the node N3 is pulled up equal to or higher than the threshold voltage of the third NMOS transistor MN3, the third NMOS transistor MN3 is turned on, to drain a current to the ground terminal. Eventually, the level of the node N3 is fixed to the threshold voltage. And, as the second NMOS transistor MN2 is turned on owing to the level of the node N3, a level of the node N2 is dropped gradually. The drop of the node N2 level results in a higher turned on resistance of the NMOS transistor MN1, which reduces a current supplied to the node N3, at the end. Therefore, by using a feedback loop of the first NMOS transistor MN1 and the second PMOS transistor MP2, and the second NMOS transistor MN2 and the third NMOS transistor MN3, a node N3 voltage of a threshold voltage level can be obtained.

In the meantime, if node N7 is at low initially, the third PMOS transistor MP3 is turned on, pulling up a level of the node N7. When the node N7 level is pulled up equal to or higher than a threshold voltage of the seventh NMOS transistor MN7, the seventh NMOS transistor MN7 is turned on, to drain a current to the ground terminal through the bipolar transistor PNP1 connected to the node N8. The bipolar transistor PNP1 is a PNP bipolar transistor. Accordingly, a level of an output terminal of the bitline precharge level supplier is fixed to a threshold voltage level identical to the node N3 level. In this instance, the bipolar transistor PNP1 serves as a PN diode which has a collector and a base connected to the ground terminal in common, and an emitter connected to the node N8. And, as the eighth NMOS transistor MN8 is turned on by a voltage of the output terminal of the bitline precharge level supplier, which is held at the threshold voltage level, voltage at the node N7 is dropped. When the node N7 voltage is dropped, a turn on resistance of the seventh NMOS transistor MN7 is increased, which reduces the current to the output terminal of the bitline precharge level supplier. Therefore, by using a feedback loop of the seventh, eighth and ninth NMOS transistors MN7, MN8 and MN9, the third PMOS transistor MP3, and the bipolar transistor PNP1 acting as a PN diode, an output voltage of a threshold voltage level can be obtained. As the fourth, fifth, sixth NMOS transistors MN4, MN5 and MN6 and the fourth and fifth PMOS transistors MP4 and MP5 form an amplifier, the node N4 voltage is amplified dependent on voltages to gates of the fourth and fifth NMOS transistors.

In the bitline precharge level supplier of the present invention operative thus, how the node N3 voltage is equalized to the output terminal voltage (an output of the bitline precharge level supplier) will be explained.

The node N3 voltage is provided to the gate of the fourth NMOS transistor, and the output terminal voltage is provided to the gate of the fifth NMOS transistor MN5. If the node N3 voltage is higher than the output terminal voltage, a node N4 voltage is pulled down and a node N5 voltage is pulled up. Since the pulled down node N4 voltage, fed back to the ninth NMOS transistor MN9, increases a turn on resistance of the ninth NMOS transistor MN9, with a reduction of a current discharged to the output terminal, a level of the output terminal is pulled up, eventually. If the node N3 voltage is lower than the output terminal voltage, the node N5 voltage is pulled down and the node N4 voltage is pulled up. Since the pulled up node N4 voltage, fedback to the ninth NMOS transistor MN9, reduces a turn on resistance of the ninth NMOS transistor MN9, with an increased current discharged to the output terminal, the level of the output terminal is reduced, eventually. In this instance, for preventing excessive reduction of the output terminal level, the bipolar transistor PNP1 operative as a PN diode is provided between the node N8 and the ground terminal so that the PN diode is turned off at a voltage below a threshold voltage of the PN diode, blocking discharge of any more current.

Figure 16A:
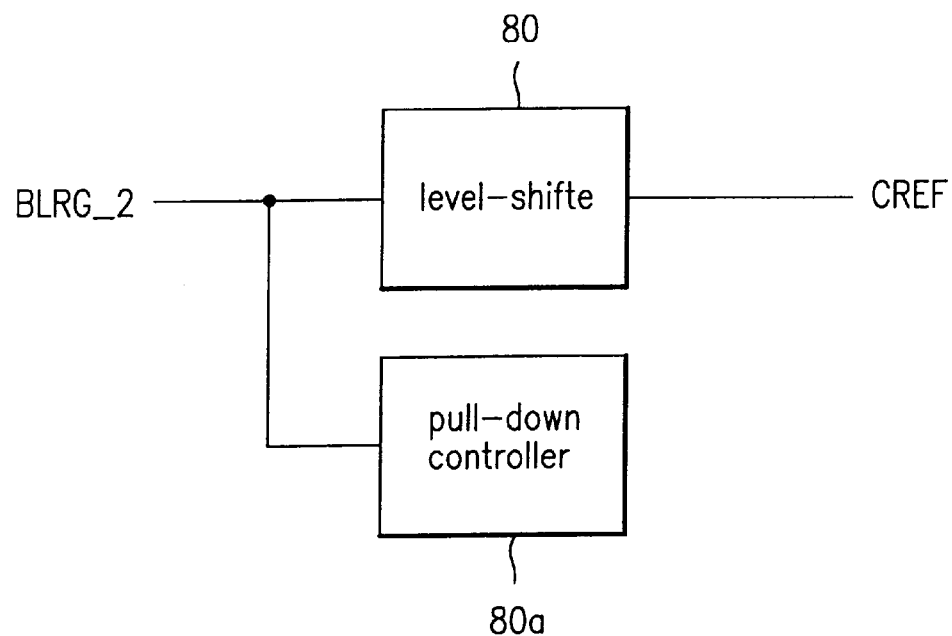
FIG. 16A illustrates a block diagram of a reference sense amplifier of the present invention.

FIG. 16A illustrates a block diagram of a reference sense amplifier of the present invention.

Figure 16B:
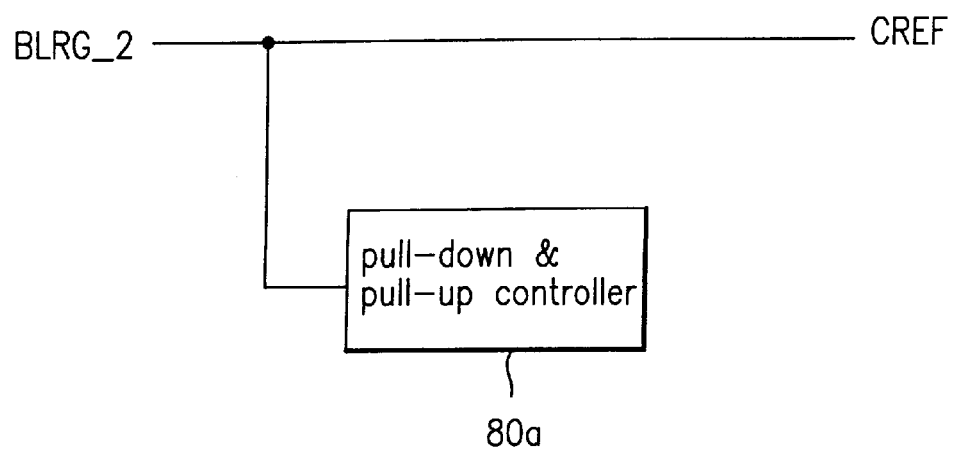
FIG. 16B illustrates a block diagram of another embodiment reference sense amplifier of the present invention.

Referring to FIG. 16A, the reference sense amplifier in the reference bitline controller includes a level shifter 80 for receiving a signal from a reference global bitline BLRG_2, shifting the signal, and providing a reference voltage CREF to the main sense amplifiers 75_1, 75_2, - - - , and a pull down controller 80*a* for receiving a signal from the reference global bitline BLRG_2 to pull down the reference bitline. Other than the method of providing the reference voltage to the main sense amplifier by shifting the level using the level shifter 80 as shown in FIG. 16A, it is also possible that the reference global bitline signal is used as the reference voltage CREF as it is without using the level shifter as shown in FIG. 16B. The case when the level shifter is not required is a case when a data, not a large sized, but less than a few hundred bits is required, such as IC cards, when adequate reference voltages can be provided only with high signals as there are not so many sense amplifiers. However, the there are many sense amplifiers as shown in FIG. 16A, the reference voltage is provided from the low signal using the level shifter.

Figure 17:
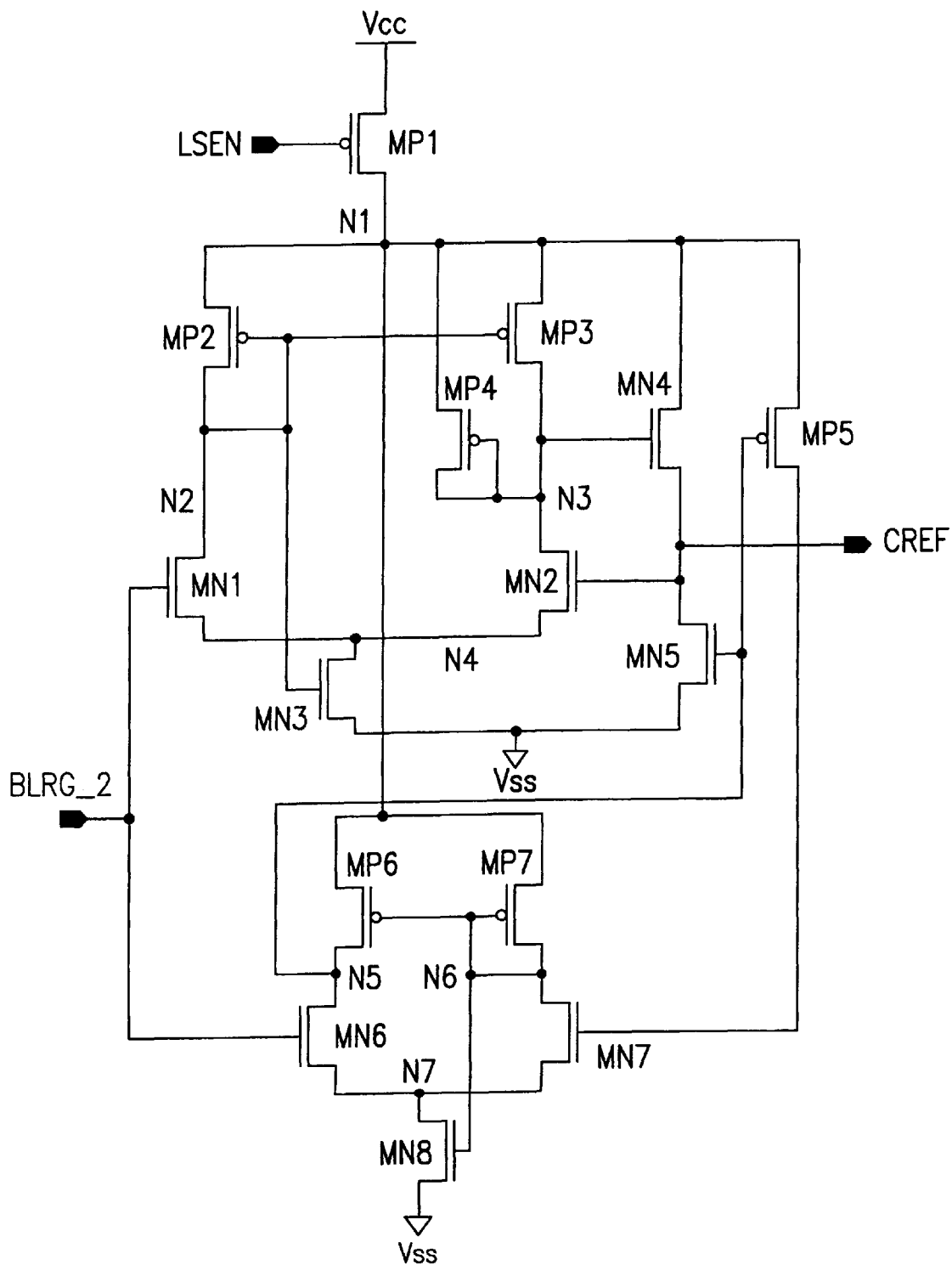
FIG. 17 illustrates a detailed system of the level shifter in FIG. 16.

The level shifter shown in FIG. 16A will be explained in detail. FIG. 17 illustrates a detailed system of the level shifter shown in FIG. 16.

Referring to FIG. 17, the level shifter includes a first PMOS transistor MP1 adapted to be controlled by an enable signal LSEN for enabling the level shifter and having a source connected to a power source Vcc, a second PMOS transistor MP2 and a third PMOS transistor MP3 connected to a drain of the first PMOS transistor MP1, a first NMOS transistor MN1 adapted to be controlled by the reference global bitline and connected to the second PMOS transistor MP2, a second NMOS transistor MN2 provided between the first NMOS transistor MN1 and the third NMOS transistor MP3, a third NMOS transistor MN3 provided between the first PMOS transistor MP1 and the ground terminal Vss, a fourth PMOS transistor MP4 provided between the first PMOS transistor MP1 and the second NMOS transistor MN2 in parallel to the third PMOS transistor MP3, a fourth NMOS transistor MN4 adapted to be controlled by a signal from the third PMOS transistor MP3 and having a source connected to the first PMOS transistor MP1, a fifth NMOS transistor MN5 formed between the ground terminal and the fourth NMOS transistor MN4, a fifth PMOS transistor MP5 formed between the first PMOS transistor MP1 and the output terminal CREF, a sixth NMOS transistor MN6 adapted to be controlled by the global bitline signal, a sixth PMOS transistor MP6 formed between the sixth NMOS transistor MN6 and the first PMOS transistor MP1, a seventh PMOS transistor MN7 having a gate connected to a gate of the sixth PMOS transistor MP6 and a source connected to a drain of the first PMOS transistor MP1, a seventh NMOS transistor MN7 formed between the sixth NMOS transistor MN6 and the seventh PMOS transistor MP7, and an eighth NMOS transistor MN6 connected between the ground terminal Vss and the seventh NMOS transistor MN7 in parallel with the sixth NMOS transistor MN6.

The operation of the aforementioned level shifter will be explained.

Referring to FIG. 17, the signal LSEN provided to the gate of the first PMOS transistor MP1 is a signal for enabling the level shifter. That is, during operation, the enabling signal LSEN is transited to low to provide the signal CREF, regularly. When the chip is disabled, the LSEN signal is transited to high to cut off the current. If the LSEN is transited to low, the first PMOS transistor MP1 is enabled, to pull up the node N1 to a high level. If the node N3 is at low initially, the fourth PMOS transistor MP4 is turned on, pulling up the node N3 level, too. Accordingly, the fourth NMOS transistor MN4 is turned on, to pull up a level of the output terminal CREF too, which level can be made to be equal to or lower than the voltage of the reference global bitline BLRG_2. The first, second, and third NMOS transistors MN1, MN2, and MN3 and the second and third PMOS transistors MP2 and MP3 form an amplifier, the node N3 voltage is amplified dependent on voltages to the gates of the first NMOS transistor MN1 and the second NMOS transistor MN2. The sixth, seventh, and eighth NMOS transistors MN6, MN7, and MN 8 and the sixth and seventh PMOS transistors MP6 and MP7 form an amplifier, the node N5 voltage is amplified dependent on voltages to the gates of the sixth NMOS transistor MN6 and the seventh NMOS transistor MN7. If sizes of the first and fifth NMOS transistors MN1 and MN5 are made greater than sizes of the second and seventh NMOS transistors MN2 and MN7, the output terminal CREF voltage can be made higher than the global bitline voltage in proportion to a device size difference. Opposite to this, if sizes of the first and sixth NMOS transistors MN1 and MN6 are made smaller than sizes of the second and seventh NMOS transistors MN2 and MN7, the output terminal CREF voltage can be made lower than the global bitline voltage in proportion to a device size difference. And, the sizes of the first and second NMOS transistors MN1 and MN2 and the sizes of the second and seventh NMOS transistors MN2 and MN7 are made identical, the output terminal voltage can be made identical to the global bitline voltage.

The operation of the level shifter in a case sizes of the first and sixth NMOS transistors MN1 and MN6 and the sizes of the second and the seventh NMOS transistors MN2 and MN7 are identical.

In a case when the global bitline voltage is higher than the output terminal CREF, the node N2 voltage is pulled down and the node N3 voltage is pulled up by the first and second NMOS transistor MN1 and MN2. Since the pulled up node N3 voltage, fedback to the fourth NMOS transistor MN4, reduces a turn on resistance of the fourth NMOS transistor MN4, a current to the output terminal CREF is increased, pulling up the output terminal voltage, eventually. Then, the node N5 voltage is pulled down and the node N6 voltage is pulled up by the sixth and seventh NMOS transistors MN6 and MN7. Since the pulled down node N5 voltage, fed back to the fifth NMOS transistor MN5 and the fifth PMOS transistor MP5, reduces a turn on resistance of the fifth NMOS transistor MN5, with an increased current to the output terminal, the output terminal voltage is pulled up. Accordingly, a voltage pulling up is hastened by the fourth NMOS transistor MN4 and the fifth PMOS transistor MP5. If the global bitline voltage is lower than the output terminal CREF voltage, the node N2 voltage is pulled up and the node N3 voltage is pulled down by the first NMOS transistor MN1 and the second NMOS transistor MN2. Since the pulled down node N3 voltage, fedback to the fourth NMOS transistor MN4, increases a turn on resistance of the fourth NMOS transistor MN4, a current to the output terminal CREF is reduced, thus reducing the output terminal CREF voltage. Then, the node N5 voltage is pulled up and the node N6 voltage is pulled down by the sixth NMOS transistor MN6 and the seventh NMOS transistor MN7. The pulled up node N5 voltage, fedback to the fifth NMOS transistor MN5 and the fifth PMOS transistor MP5, reduces a turn on resistance of the fifth NMOS transistor MN5, and increases a turn on resistance of the fifth PMOS transistor MP5. According to this, a current to the output terminal CREF is reduced, pulling down the output terminal voltage, eventually. This hastens a voltage drop by the fifth NMOS transistor MN5.

Figure 18:
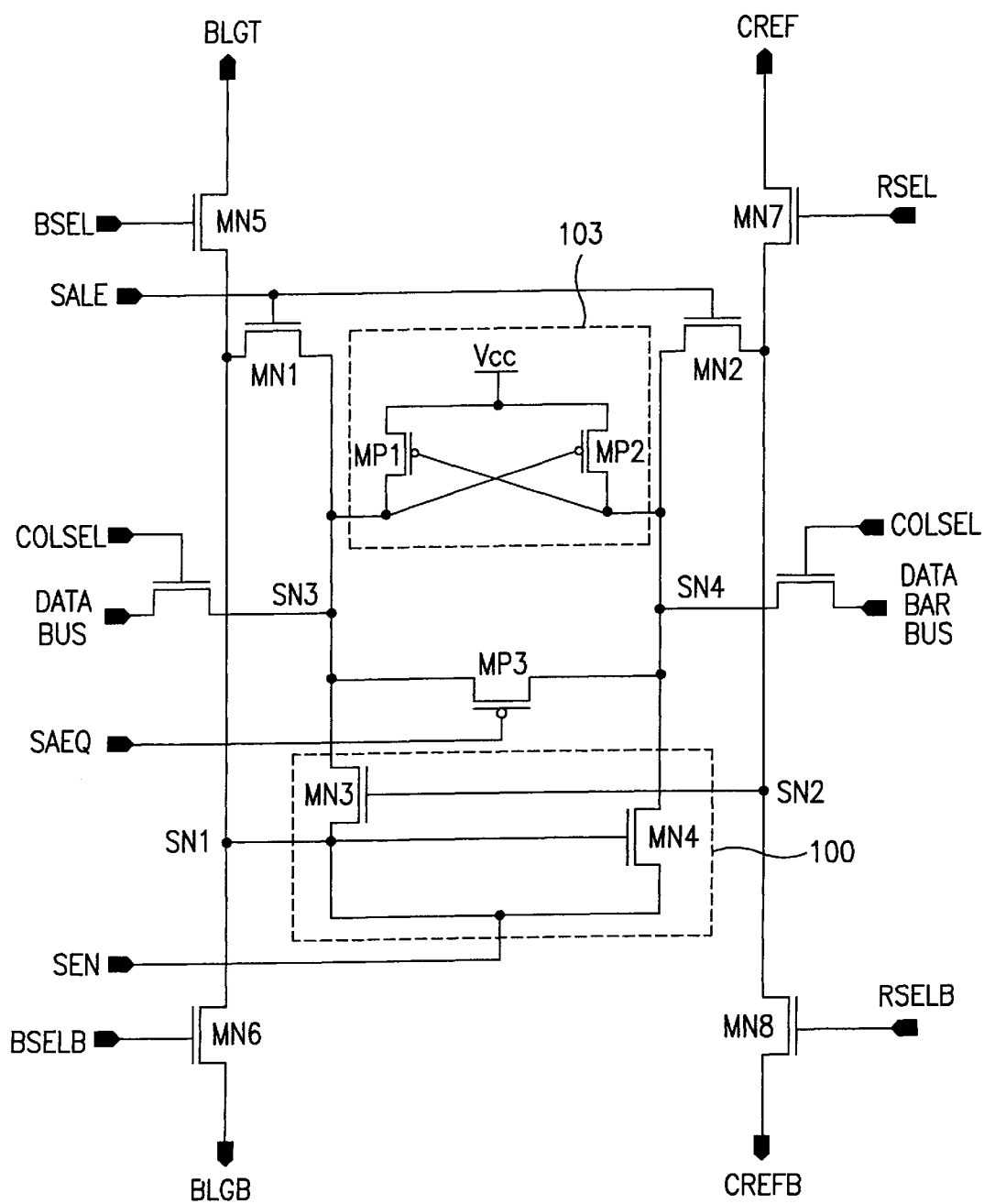
FIG. 18 illustrates a detailed system of a sense amplifier in accordance with a first preferred embodiment of the present invention.

FIG. 18 illustrates a detailed system of a sense amplifier in accordance with a first preferred embodiment of the present invention. Alike the aforementioned system shown in FIG. 8B which is formed by repetition of the system in FIG. 8A, the bitline controller 75 is provided between two main cell arrays 71. Therefore, the sense amplifiers in the bitline controller 75 is preferably provided to sense data both from the upper main cell array 71 and the lower main cell array 71. That is, the system provided such that the upper main cell array and the lower main cell array share the bitline controller. The BLGT denotes a main global bitline connected to the upper cell array and the BLGB denotes a main global bitline connected to the lower cell array. And, the CREF denotes a reference global bitline connected to the upper reference cell, and the CREFB denotes a reference global bitline connected to the lower reference cell.

Referring to FIG. 18, the sense amplifier includes a first NMOS transistor MN1 having a source connected to the BLGT and BLGB, a second NMOS transistor MN2 having a source connected to the CREF and the CREFB and a gate connected to a gate of the first NMOS transistor MN1, third NMOS transistor MN3 for amplifying the BLGT signal or the BLGB signal received through the first NMOS transistor MN1, a fourth NMOS transistor MN4 for amplifying the CREF or CREFB signal received through the second NMOS transistor MN2, a first PMOS transistor MP1 and a second PMOS transistor MP2 each having a source connected to a power source terminal Vcc and a drain connected to an output terminal of the first NMOS transistor MN1 and an output terminal of the second NMOS transistor MN2 respectively (a drain of the first PMOS transistor is connected to a gate of the second PMOS transistor, and a drain of the second PMOS transistor is connected to a gate of the first PMOS transistor), and a third PMOS transistor MP3 for equalizing an output terminal of the first NMOS transistor MN1 and an output terminal of the second NMOS transistor MN2 in response to a sense amplifier equalizing signal SAEQ. There is a fifth NMOS transistor MN5 between a source of the first NMOS transistor MN1 and the BLGT, and a sixth NMOS transistor MN6 between a source of the first NMOS transistor MN1 and the BLGB. And, there is a seventh NMOS transistor MN7 between a source of the second NMOS transistor MN2 and the CREF, an eighth NMOS transistor MN8 between a source of the second NMOS transistor MN2 and the CREFB. And, there is a ninth NMOS transistor MN9 for selectively switching a data bus and an output terminal of the sense amplifier in response to a column selection signal COSEL, a tenth NMOS transistor MN10 for switching a data bar bus and an output terminal of the sense amplifier. The fifth NMOS transistor MN5 switches between the sense amplifier and the BLGT, and the sixth NMOS transistor MN6 switches between the sense amplifier and the BLGB. And, the seventh NMOS transistor MN7 switches between the sense amplifier and the CREF, and the eighth NMOS transistor MN8 switches between the sense amplifier and the CREFB.

The operation of the first embodiment sense amplifier will be explained. The following explanations are based on a case when a data stored in the upper main cell is sensed.

Referring to FIG. 18, when the fifth and seventh NMOS transistors MN5 and MN7 are enabled in response to an enable signal BSEL for use in enabling the fifth NMOS transistor MN5 and an enable signal RSEL for use in enabling the seventh NMOS transistor MN7 respectively, the sixth and seventh NMOS transistors MN5 and MN7 are disabled. Opposite to this, if the sixth and eighth NMOS transistors MN6 and MN8 are enabled, the fifth and seventh NMOS transistors MN5 and MN7 are disabled. The sense amplifier is disabled in response to a column selection signal COSEL during an initial amplification period, cutting between an eternal data bus and an internal node of the sense amplifier. In this instance, in order to enable the sense amplifier, voltages of the node SN3 and the node SN4 are equalized in response to the sense amplifier equalizer signal SAEQ. At an initial stage, the first NMOS transistor MN1 and the second NMOS transistor MN2 are held disabled. When the node SN3 and the node SN4 are equalized, the data in the main cell is transferred to the upper global bitline BLGT, then, to the node SN1 through the fifth NMOS transistor MN5. The reference voltage is transferred to the CREF, then, to the node SN2 through the seventh NMOS transistor MN7. After the data in the main cell and the reference voltage are transferred to the node SN1 and SN2 adequately, the reference voltage to the sense amplifier is transited to a ground voltage. According to this, since there is a voltage difference between the gate of the third NMOS transistor and the gate of the fourth NMOS transistor as much as a voltage difference between the node SN1 and the node SN2, with a difference between a current to the third NMOS transistor MN3 and the fourth NMOS transistor MN4, if the amplification starts from this condition, the amplified voltages exhibit a voltage difference between the node SN3 and the node SN4. The voltages induced at the node SN3 and the node SN4 are respectively amplified by the first PMOS transistor MP1 and the second PMOS transistor MP2, again. After the voltages are amplified by the first PMOS transistor MP1 and the second PMOS transistor MP2 adequately, the amplified voltages disable the fifth and seventh NMOS transistors MN5 and MN7, and also enable the first and second NMOS transistor MN1 and MN2, to feedback the amplified voltages at nodes SN3 and SN4 to the nodes SN1 and SN2 again, thereby keeping amplifying the voltages. In this instance, once the feed back loop is completed, the ninth and tenth NMOS transistors MN9 and MN10 are enabled, to make data exchange between external data bus and data bar bus and the sense amplifier. And, the fifth NMOS transistor MN5 is enabled again, to transfer the node SN1 voltage to the BLGT, to feed back and restore in the main cell. According to the aforementioned sense amplifier operation, the third NMOS transistor MN3 and the fourth NMOS transistor MN4 form a first amplifier 100, and the first PMOS transistor MP1 and the second PMOS transistor MP2 form a second amplifier 103. Herein, the unexplained symbol SEN, representing a sense amplifier signal, is a low active signal, and the SALE signal, representing a signal for enabling the first NMOS transistor MN1 and the second NMOS transistor MN2, is a high active signal.

Figure 19:
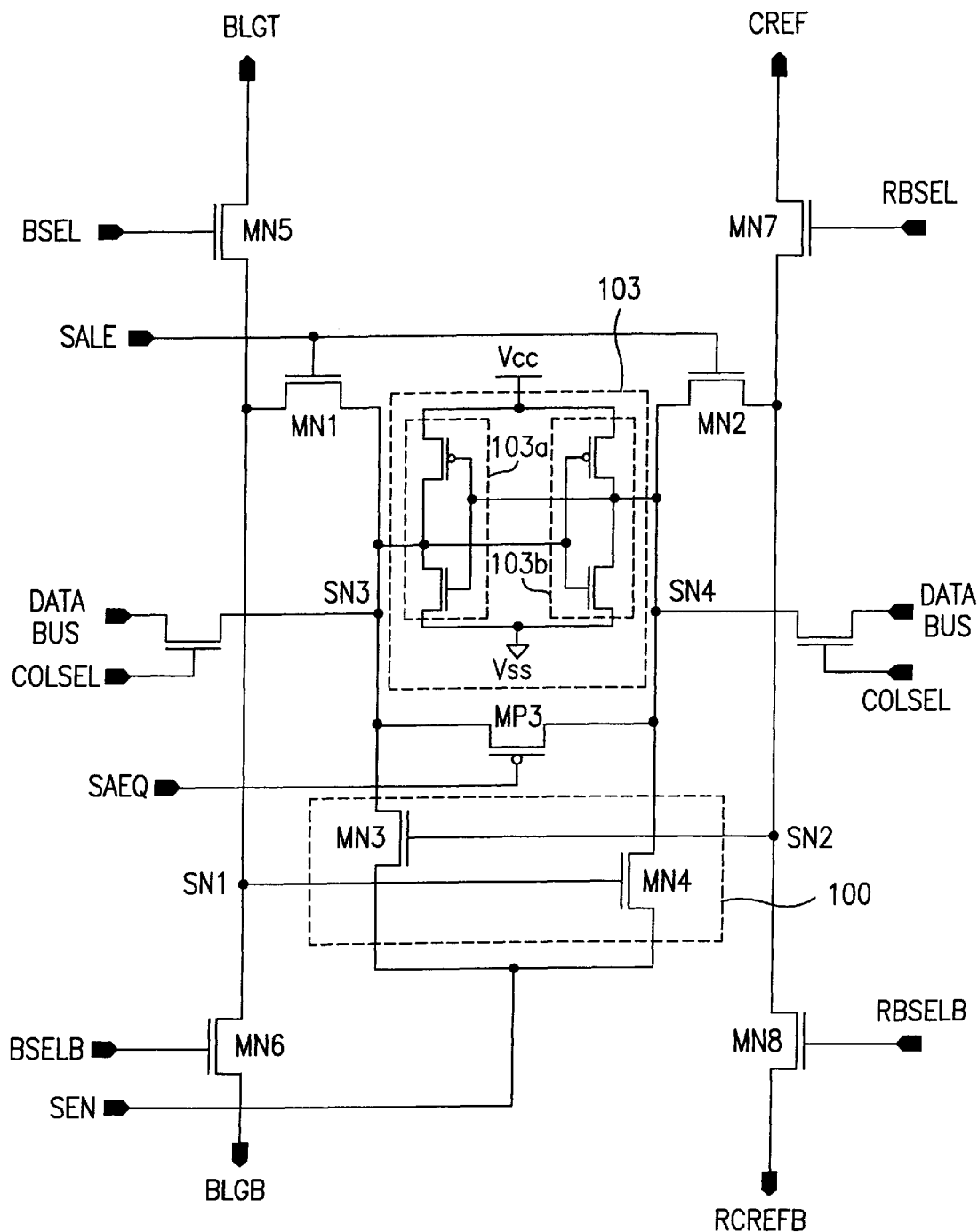
FIG. 19 illustrates a sense amplifier in accordance with a second preferred embodiment of the present invention.

FIG. 19 illustrates a sense amplifier in accordance with a second preferred embodiment of the present invention. Upon comparison of the second embodiment sense amplifier to the first embodiment sense amplifier, it can be known that the second amplifier is different from the first embodiment.

The first embodiment second amplifier 103 includes the first PMOS transistor and the second PMOS transistor, wherein the drain of the first transistor is connected to the gate of the second transistor, and the drain of the second transistor is connected to the gate of the first transistor. Opposite to this, the second embodiment second amplifier 103 includes a latch circuit, inclusive of a first inverter 103a and a second inverter 103b each having a PMOS and an NMOS transistors, wherein a common gate of the PMOS and NMOS transistors in the first inverter 103a is connected to a drain of the PMOS transistor in the second inverter 103b. And, a common gate of the PMOS and the NMOS transistors in the second inverter 103b is connected to a drain of the PMOS transistor in the first inverter 103a. Because parts other than the second amplifier 103 are identical with the sense amplifier of the first embodiment, further explanation of the second embodiment sense amplifier will be omitted and identical reference symbols are used for the identical parts.

The operation of the second embodiment sense amplifier will be explained. Alike the case of explanation of the first embodiment sense amplifier, only one of the upper cell array and the lower cell array is enabled. That is, if the upper cell array is enabled, the fifth NMOS transistor MN5 is enabled, the sense amplifier is connected to the main global bitline BSGT to which a data is transferred from the upper cell array, the seventh NMOS transistor MN7 is enabled, so that the sense amplifier receives a reference voltage CREF through a reference global bitline. And, if the lower cell array is enabled, the sixth NMOS transistor MN6 is enabled, to connect the sense amplifier to the main global bitline BSGB adapted to be provided with a data from the lower cell array, and the eighth NMOS transistor MN8 is enabled, such that the sense amplifier receives the reference voltage CREFB. The SEN signal in FIG. 19 is a signal for enabling the sense amplifier, the SAEQ signal is a signal for equalizing the SN3 and SN4, and the transistor operated in response to the SAEQ signal may be a PMOS transistor or an NMOS transistor.

Figure 20:
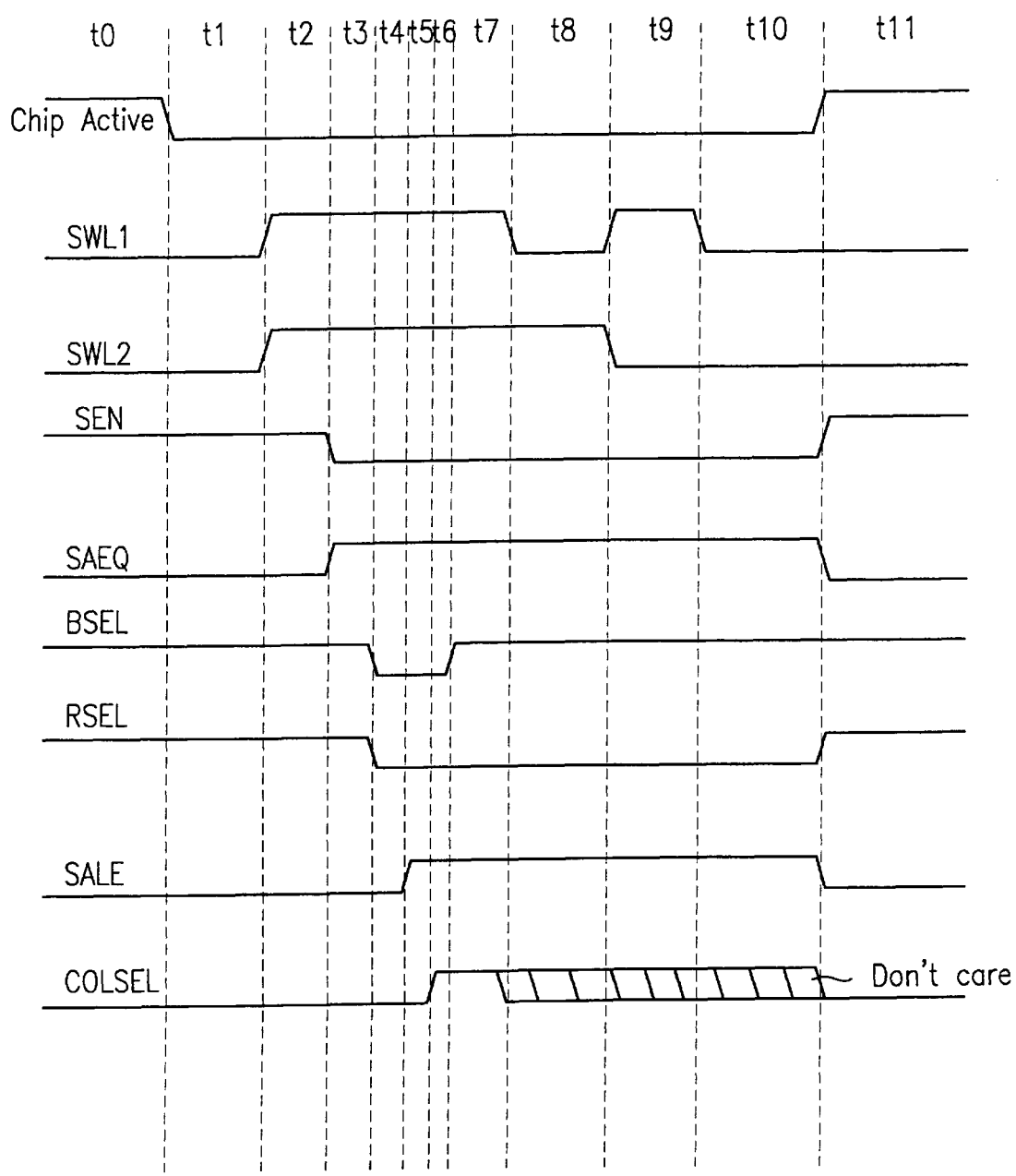
FIG. 20 illustrates an operation timing diagram of the sense amplifier in accordance with first, and second preferred embodiments of the present invention.
Figure 21:
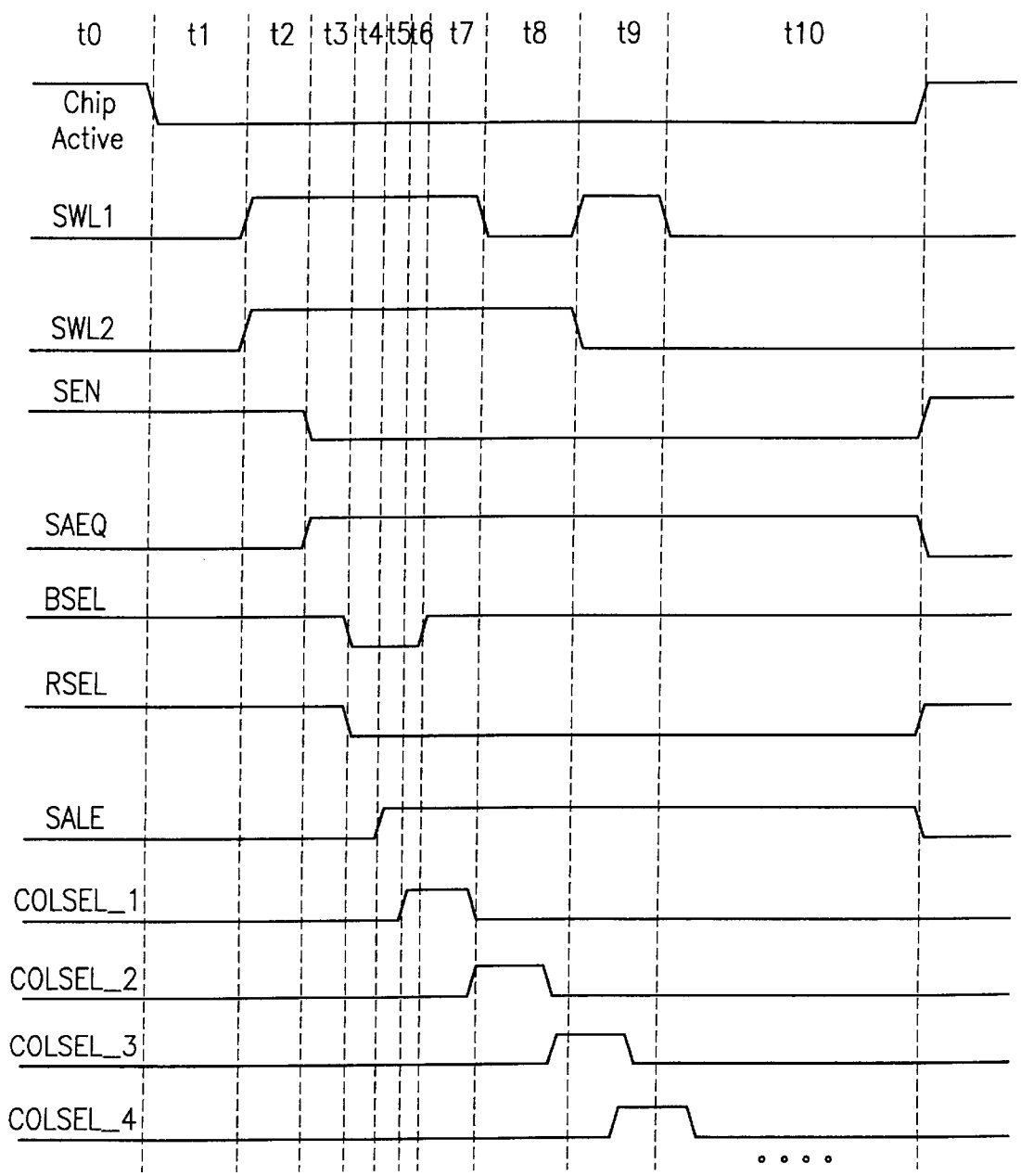
FIG. 21 illustrates an operation timing diagram in a read mode of a sense amplifier.
Figure 22:
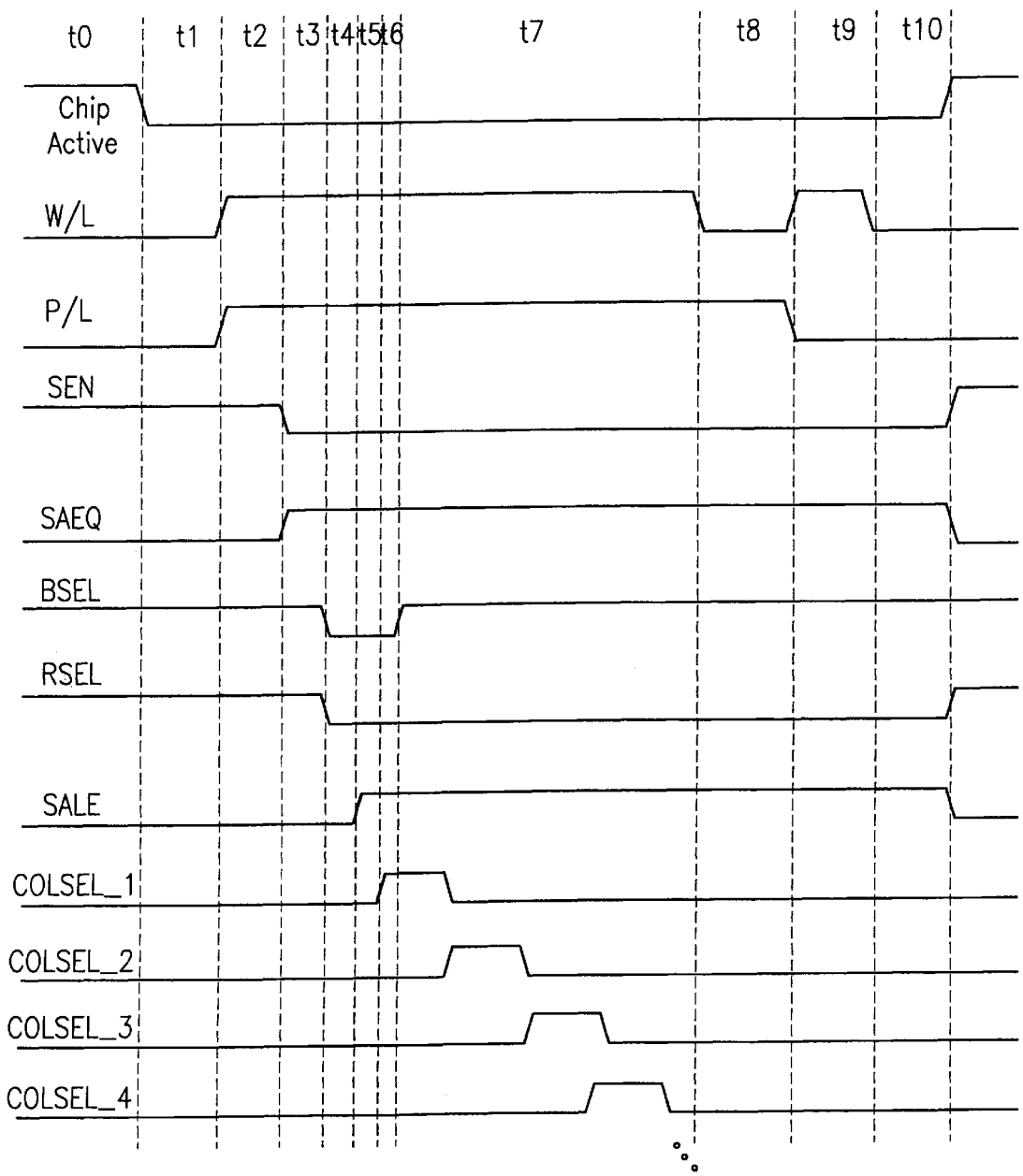
FIG. 22 illustrates an operation timing diagram in a write mode of a sense amplifier.

Operation timing diagrams of the first and second embodiment sense amplifiers are shown in FIGS. 20, 21 and 22. That is, FIG. 20 illustrates an operation timing diagram of the sense amplifier in accordance with first, and second preferred embodiments of the present invention, FIG. 21 illustrates an operation timing diagram in a read mode of a sense amplifier, and FIG. 22 illustrates an operation timing diagram in a write mode of a sense amplifier.

Referring to FIG. 21, if the signal SALE enabling the first and second NMOS transistor MN1 and MN2 shown in FIG. 18 is transited to a high level in a period both the first split wordline SWL1 and the second split wordline SWL2 are high, the column selection signals are transited to high levels in succession until a $t10$ period.

Referring to FIG. 22, different from the read mode, in a case of write mode, the column selection signals are transited only in periods of $t6$~$t7$ in succession within a period both the first split wordline SWL1 and the second split wordline SWL2 are high. That is, the column selection signals COLSEL1, COLSEL2, COLSEL3, - - - , COLSELn are transited in succession in $t6$~$t7$ periods if the signal SALE enabling the first and second NMOS transistors MN1 and MN2 shown in FIG. 18 is transited to a high level within a period both the first and second split wordline SWL1 and SWL2 are high. Upon transition of all the column selection signals are completed, the first split wordline SWL1 is transited to low, and, when the first split wordline SWL1 is transited from low to high, the second split wordline SWL2 is transited to low.

Figure 23:
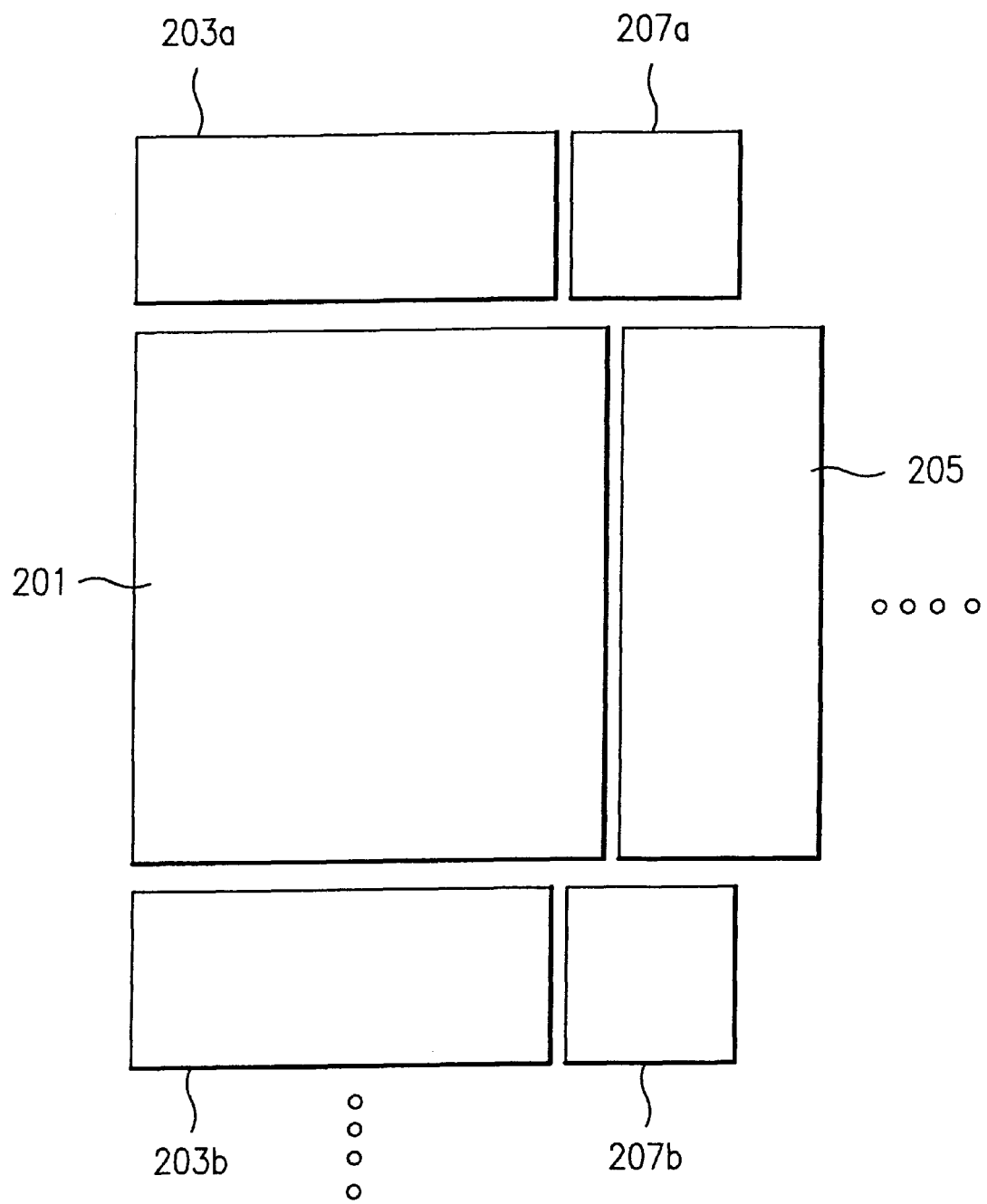
FIG. 23 illustrates a system of cell array of the nonvolatile ferroelectric memory in accordance with a second preferred embodiment of the present invention.

FIG. 23 illustrates a system of the cell array of a non-volatile ferroelectric memory in. accordance with a second preferred embodiment of the present invention. In comparison to the cell array shown in FIG. 8A, it can be known that the cell array shown in FIG. 23 has the main bitline controllers and the reference bitline controllers provided, not only on a lower side of the main cell array, but also on an upper side of the main cell array, for more effective use of a layout.

That is, referring to FIG. 23, the cell array includes a main cell array 201, a first main bitline controller 203a and a second main bitline controller 203b formed on an upper side and a lower side of the main cell array 201, a split wordline driver 205 formed on one side of the main cell array 201, and a first reference bitline controller 207a and a second reference bitline controller 207b formed one side of the first and second main bitline controllers 203a and 203b, respectively. The aforementioned system will be explained in more detail centered on the main cell array.

Figure 24:
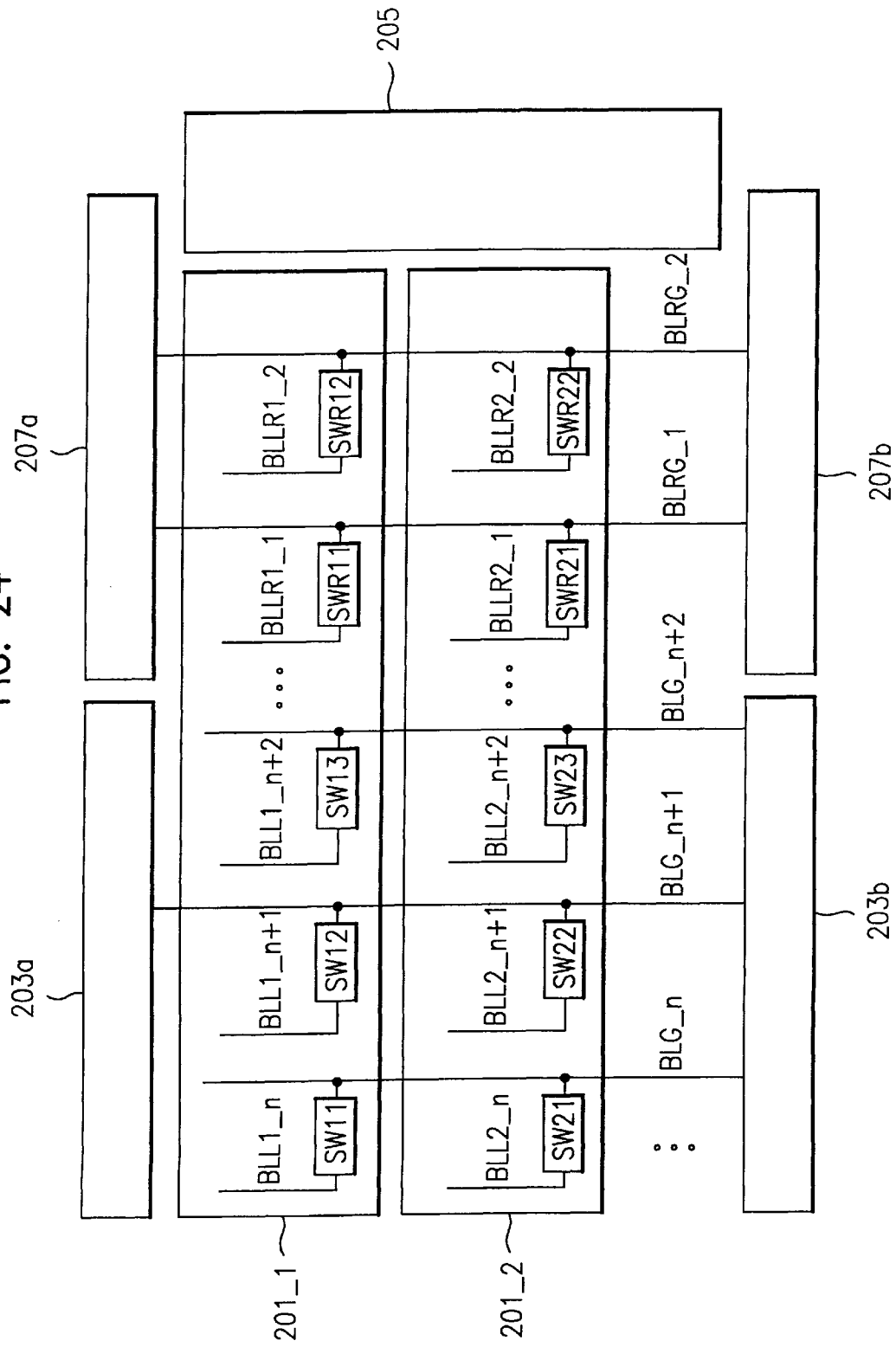
FIG. 24 illustrates a detailed system of the cell array in FIG. 23 centered on the main cell array.

FIG. 24 illustrates a detailed system of the cell array in FIG. 23 centered on the main cell array.

Referring to FIG. 24, of the main global bitlines in the main cell array 201, odd numbered main global bitlines BLG_n, BLG_n+2, BLG_n+4, - - - are connected to the second main bitline controller 203b below the main cell array 201, and the even numbered main global bitlines BLG_n+1, BLG_n+3, BLG_n+5, - - - are connected to the first main bitline controller 203a. above the main cell array 201. And, the reference global bitlines BLRG_1, BLRG_2 are connected to the reference bitline controllers 207a and 207b above and below the main cell array 201; each of the reference bitline controllers 207a and 207b takes the two reference global bitlines BLRG_1 and BLRG_2. And, as explained, the main cell array 201 includes a plurality of sub cell arrays 201_1, 201_2, - - - . Each sub cell array has main local bitlines in correspondence to the main global bitline. For example, a plurality of main local bitlines BLL1_n, BLL2_n, - - - , BLLn-n are provided in correspondence to the first main global bitline BRG_n. And, the reference global bitlines BLRG_1 and BLRG_2 are provided with reference local bitlines. For example, a plurality of reference local bitlines BLLR1_1, BLLR2_1, - - - , BLLRn_1 are provided in correspondence to the first reference global bitline BLRG_1. The main local bitlines formed for every sub cell array are connected/disconnected through relevant main global bitlines and switches SW11~Swnn. Accordingly, as the switches are turned on/off selectively, relevant main local bitlines are connected to the main global bitline. If any one turned on switch among the switches SW11, SW12, SW13, - - - , SWM1n in any one sub cell array, for example, the first sub cell array 201_1 is connected with an odd numbered main global bitline BLG_n, or BLG_n+2, or BLG_n+4, - - - , a data of the main local bitline is transferred to the main sense amplifier (not shown) in the second main bitline controller 203b. If any one turned on switch among the switches SW11, SW12, SW13, - - - , SWM1n in any one sub cell array, for example, the first sub cell array 201_1 is connected with an even numbered main global bitline BLG_n+1, or BLG_n+3, or BLG_n+5, - - - , a data of the main local bitline is transferred to the reference sense amplifier (not shown) in the first main bitline controller 203a.

Figure 25:
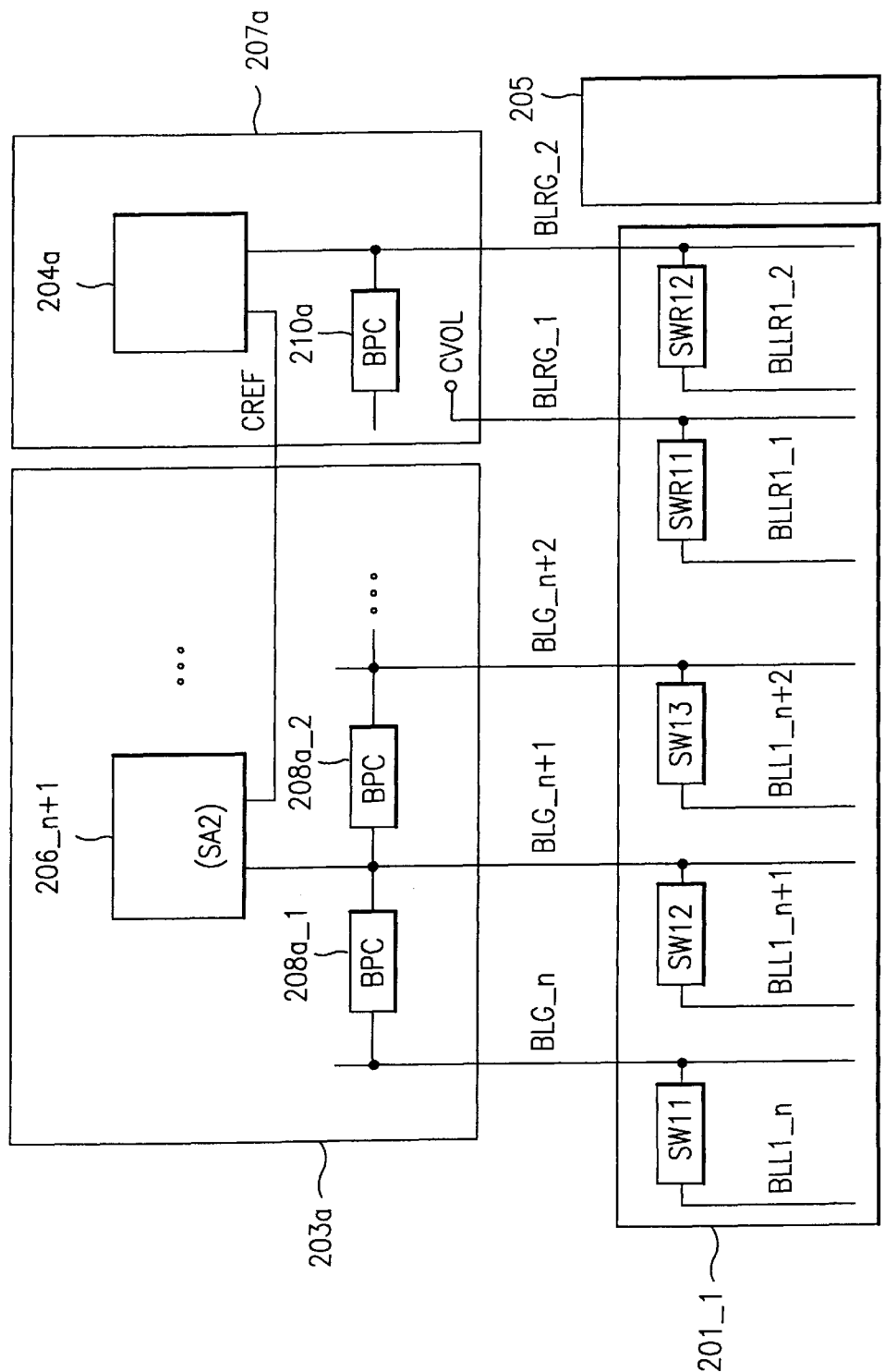
FIG. 25 illustrates a detailed system of the cell array in FIG. 23 centered on the first main bitline controller and the first reference bitline controller; and, FIG. 26 illustrates a detailed system of the cell array in FIG. 23 centered on the second main bitline controller and the second reference bitline controller.

FIG. 25 illustrates a detailed system of the cell array in FIG. 23 centered on the first main bitline controller and the first reference bitline controller.

Referring to FIG. 25, the first reference bitline controller 207a has one reference sense amplifier 204a, and the first main bitline controller 203a has a main sense amplifier 206_n+1, 206_n+3, 206_n+5, - - - on every even numbered main global bitline BLG n+1, BLG n+3, BLG_n+5, - - - . And, since the odd numbered main global bitline BLG_n, BLG_n+2, BLG_n+4, - - - are connected to the second main bitline controller (not shown), the second main bitline controller has a main sense amplifier (not shown). And, alike the first embodiment of the present invention shown in FIG. 13, there is a bitline precharge circuit 208a_1, 208a_2, - - - between adjacent main global bitlines. And, of the main global bitlines, a bitline prechrage circuit 210a is also provided between a last main global bitline and the reference global bitline BLRG_2 connected to the reference sense amplifier 204a. Of the two reference global bitlines BLRG_1 and BLRG_2 taken by the first reference bitline controller 207a, one is connected to the reference sense amplifier 204a, and the other has a constant voltage applied thereto. And, the main sense amplifiers 206_n+1, 206_n+3, - - - in the first main bitline controller 203a has the reference voltage CREF provided to the reference sense amplifier 204a applied thereto in common.

Figure 26:
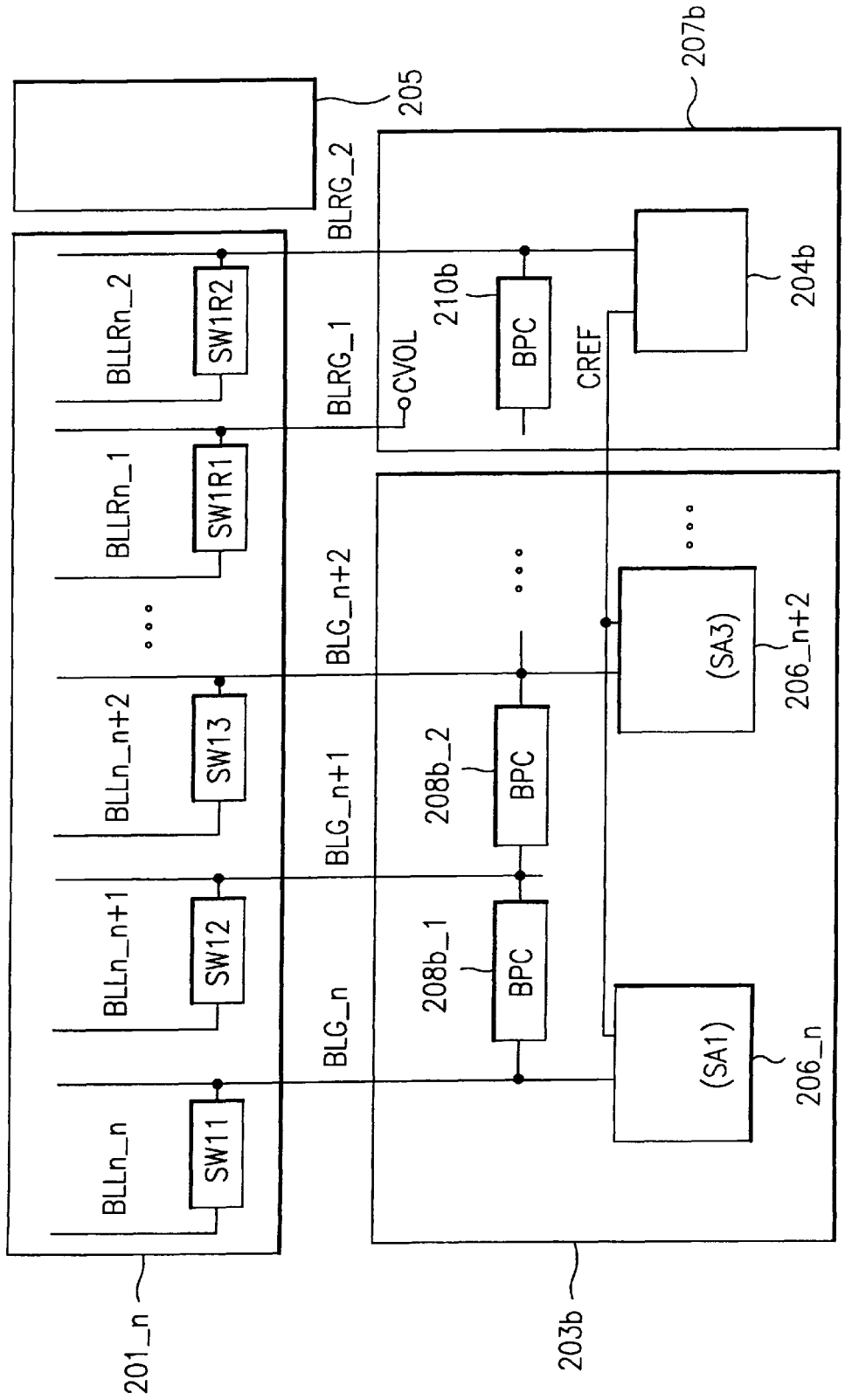

FIG. 26 illustrates a detailed system of the cell array in FIG. 23 centered on the second main bitline controller and the second reference bitline controller.

Referring to FIG. 26, systems of the second main bitline controller 203b and the second reference bitline controller 207b are identical to the first main bitline controller 203a and the first reference bitline controller 207a. That is, the second reference bitline controller 207b has one reference sense amplifier 204b, and the second main bitline controller 203b has a main sense amplifier 206_n, and 206_n+2 on every odd numbered main global bitline BLG_n, BLG_n+2, - - - . One of the reference sense amplifier 204b has one reference global bitline BLRG_2 connected thereto, and the other one has a constant voltage applied thereto. And, there is a bitline precharge circuit 208b_1 and 208b_2, - - - between adjacent main global bitlines, and the main sense amplifiers 206_n, 206_n+2, - - - have the reference voltage CREF provided from the reference sense amplifier 204b applied thereto in common. Explanation on a detailed system of the second embodiment sub cell array of the present invention is omitted as the system is identical to the first embodiment system explained in FIG. 11. And, systems of the sense amplifier, the level shifter, the bitline precharge level supplier of the nonvolatile memory in accordance with a second preferred embodiment of the present invention are identical to the aforementioned first embodiment of the present invention.

As explained, the driver for driving the non-volatile ferroelectric memory of the present invention has the following advantages.

Because the main cell is accessed once when the reference cell is accessed once, numbers of the access to the reference cell and to the main cell are identical. Therefore, different from the related art in which the reference cell is accessed excessively in comparison to the main cell, as induced voltages by the reference cell and by the main cell can be sustained identical, a device lifetime can be prolonged, and a stable sensing operation can be made as the noise is minimized.

It will be apparent to those skilled in the art that various modifications and variations can be made in the non-volatile ferroelectric memory of the present invention without departing from the spirit or scope of the invention. Thus, it is intended that the present invention cover the modifications and variations of this invention provided they come within the scope of the appended claims and their equivalents.

What is claimed is:

1. A nonvolatile ferroelectric memory comprising:

a main cell array including;

a plurality of sub cell arrays, a plurality of main global bitlines and at least one pair of reference global bitlines formed across the sub cell arrays, main local bitlines and reference local bitlines formed in correspondence to the main global bitlines and the reference global bitlines, and switches provided between local bitlines and relevant global bitlines;

a reference bitline controller including a reference sense amplifier formed either above or below the main cell array for sensing a signal provided through one of the one pair of reference global bitlines, to provide a reference voltage;

a main bitline controller including a plurality of main sense amplifiers each formed on one side of the reference bitline controller and connected to one of the main global bitlines for receiving the reference voltage to sense a signal provided through a relevant global bitline; and, a split wordline driver formed on one side of the main cell array.

2. A nonvolatile ferroelectric memory as claimed in claim 1, wherein the sub cell array includes;

a plurality of pairs of a first split wordline and a second split wordline formed perpendicular to the global bitlines, first unit cells each formed between adjacent first split wordline and second split wordline and connected to an odd numbered main local bitline, and second unit cells each formed between adjacent first split wordline and second split wordline and connected to an even numbered main local bitline.

3. A nonvolatile ferroelectric memory as claimed in claim 2, wherein each of the first unit cells includes;

a first transistor having a gate terminal connected to the first split wordline and a source terminal connected to the first bitline, and a first ferroelectric capacitor between a drain terminal of the first transistor and the second split wordline.

4. A nonvolatile ferroelectric memory as claimed in claim 2, wherein each of the second unit cells includes;

a second transistor having a gate terminal connected to the second split wordline and a source terminal connected to the second bitline, and a second ferroelectric capacitor between a drain terminal of the second transistor and the first split wordline.

5. A nonvolatile ferroelectric memory as claimed in claim 1, wherein the main bitline controller further includes a bitline precharge circuit for precharging adjacent global bitlines to certain levels.

6. A nonvolatile ferroelectric memory as claimed in claim 2, wherein a data of only one of the plurality of unit cells connected to a relevant local bitline are selectively provided to the global bitline.

7. A nonvolatile ferroelectric memory as claimed in claim 5, wherein the bitline precharge circuit includes;

a plurality of global bitlines, bitline equalizing switches between the global bitlines, and a plurality of bitline precharge switches for switching a precharge signal for use in precharging the bitline to each of the global bitlines.

8. A nonvolatile ferroelectric memory as claimed in claim 7, wherein the precharge signal is provided from a bitline precharge level supplier, the bitline precharge level supplier including;

a first PMOS transistor having a source connected to a power source terminal and adapted to be controlled in response to an enable signal, a second PMOS transistor having a source connected to a drain of the first PMOS transistor, and a drain and a gate connected together, a first NMOS transistor connected to a drain of the first PMOS transistor in parallel with the second PMOS transistor and having a gate connected to a gate of the second PMOS transistor, a second NMOS transistor connected in series with the second PMOS transistor and having a gate connected to a drain of the second PMOS transistor, a third NMOS transistor having a gate and a drain connected to a drain of the first NMOS transistor in common and a source connected to a ground terminal, a fourth NMOS transistor having a gate connected to a drain of the first NMOS transistor for being controlled by a drain voltage of the first NMOS transistor, a fifth NMOS transistor disposed opposite to the fourth NMOS transistor and having a drain connected to a drain of the fourth NMOS transistor, a sixth NMOS transistor having a drain connected to a common drain of the fourth and fifth NMOS transistors and a source connected to a ground terminal, a fourth PMOS transistor connected between a source of the fourth NMOS transistor and a drain of the first PMOS transistor, a fifth PMOS transistor connected between a source of the fifth NMOS transistor and a drain of the first PMOS transistor, a third PMOS transistor arranged in parallel with the first NMOS transistor with respect to a drain of the first PMOS transistor and having a drain and a gate connected together, a seventh NMOS transistor arranged opposite to the third PMOS transistor and having a gate connected to a gate of the third PMOS transistor, an eighth NMOS transistor having a gate connected to a drain of the seventh NMOS transistor, and a source connected to a drain of the third PMOS transistor, a ninth NMOS transistor adapted to be controlled by a drain voltage of the fourth PMOS transistor and connected in series with the seventh NMOS transistor, and a bipolar transistor having an emitter connected to a drain of the ninth transistor and a collector and a base connected to a ground terminal in common.

9. A nonvolatile ferroelectric memory as claimed in claim 1, wherein the reference sense amplifier includes;

a level shifter for shifting a level of the signal provided through the reference global bitline, and a pull down controller for pulling down the reference global bitline, wherein the level shifter includes;

a first PMOS transistor adapted to be controlled by an enable signal for enabling the level shifter and having a source connected to a power source terminal, a second PMOS transistor and a third PMOS transistor connected to a drain of the first PMOS transistor, a first NMOS transistor adapted to be controlled by the reference global bitline and connected to the second PMOS transistor, a second NMOS transistor provided between the first NMOS transistor and the third NMOS transistor, a third NMOS transistor provided between the first NMOS transistor and the ground terminal, a fourth PMOS transistor provided between the first PMOS transistor and the second NMOS transistor in parallel to the third PMOS transistor, a fourth NMOS transistor adapted to be controlled by a signal from the third PMOS transistor and having a source connected to the first PMOS transistor, a fifth NMOS transistor formed between the ground terminal and the fourth NMOS transistor, a fifth PMOS transistor formed between the first PMOS transistor and the output terminal, a sixth NMOS transistor adapted to be controlled by the global bitline signal, a sixth PMOS transistor formed between the sixth NMOS transistor and the first PMOS transistor, a seventh PMOS transistor having a gate connected to a gate of the sixth PMOS transistor and a source connected to a drain of the first PMOS transistor, a seventh NMOS transistor formed between the sixth NMOS transistor and the seventh PMOS transistor, and an eighth NMOS transistor connected between the ground terminal and the seventh NMOS transistor in parallel with the sixth NMOS transistor.

10. A nonvolatile ferroelectric memory as claimed in claim 1, wherein the main sense amplifier includes;

a first NMOS transistor having a source connected to a global bitline which is connected to both an upper main cell and a lower main cell, a second NMOS transistor having a source connected to the reference global bitline which is connected to both an upper reference cell and a lower reference cell, and a gate connected to a gate of the first NMOS transistor, a third NMOS transistor for amplifying a signal on the global bitline connected to an upper main cell or on the global bitline connected to a lower main cell received through the first NMOS transistor, a fourth NMOS transistor for amplifying a signal of the reference global bitline connected to an upper reference cell or the reference global bitline connected to a lower reference cell received through the second NMOS transistor, a first PMOS transistor and a second PMOS transistor each having a source connected to a power source terminal and a drain connected to an output terminal of the first NMOS transistor and an output terminal of the second NMOS transistor respectively, and a third PMOS transistor for equalizing an output terminal of the first NMOS transistor and an output terminal of the second NMOS transistor in response to a sense amplifier equalizing signal.

11. A nonvolatile ferroelectric memory as claimed in claim 10, wherein a drain of the first PMOS transistor is connected to a gate of the second PMOS transistor, and a drain of the second PMOS transistor is connected to a gate of the first PMOS transistor.

12. A nonvolatile ferroelectric memory as claimed in claim 10, further including a fifth NMOS transistor between a source of the first NMOS transistor and the global bitline connected to the upper main cell, a sixth NMOS transistor between a source of the first NMOS transistor and the global bitline connected to the lower main cell, a seventh NMOS transistor between a source of the second NMOS transistor and the reference global bitline connected to the upper reference cell, and an eighth NMOS transistor between a source of the second NMOS transistor and the reference global bitline connected to the lower reference cell.

13. A nonvolatile ferroelectric memory as claimed in claim 10, further including a ninth NMOS transistor for selectively switching a data bus and an output terminal of the sense amplifier in response to a column selection signal, and a tenth NMOS transistor for switching a data bar bus and an output terminal of the sense amplifier.

14. A nonvolatile ferroelectric memory as claimed in claim 13, wherein, if the signal enabling both the first and second NMOS transistors is transited to a high level in a period both the first split wordline and the second split wordline are high in a read mode, the column selection signals are transited to high levels in succession until the signal is transited to a low level.

15. A nonvolatile ferroelectric memory as claimed in claim 13, wherein, if the signal enabling both the first and second NMOS transistors is transited to a high level in a period both the first split wordline and the second split wordline are high in a write mode, the column selection signals are transited to high levels in succession until the first split wordline is transited to a low level.

16. A nonvolatile ferroelectric memory as claimed in claim 10, wherein the third NMOS transistor and the fourth NMOS transistor form a first amplifier for amplifying an input voltage for the first time, and the first PMOS transistor and the second PMOS transistor form a second amplifier for amplifying the voltage amplified by the first amplifier for the second time.

17. A nonvolatile ferroelectric memory as claimed in claim 16, wherein the second amplifier includes a latch circuit, the latch circuit including a first inverter and a second inverter each having a PMOS and an NMOS transistors, wherein a common gate of the PMOS and NMOS transistors in the first inverter is connected to a drain of the PMOS transistor in the second inverter, and a common gate of the PMOS and the NMOS transistors in the second inverter is connected to a drain of the PMOS transistor in the first inverter.

* * * * *